US010068702B2

(12) United States Patent
Posat et al.

(10) Patent No.: US 10,068,702 B2
(45) Date of Patent: Sep. 4, 2018

(54) SYSTEMS AND METHODS FOR POWER TRANSFER BASED ON RESONANCE COUPLING OF INDUCTORS

(71) Applicant: Maxim Integrated Products, Inc., San Jose, CA (US)

(72) Inventors: Baris Posat, San Jose, CA (US); Roberto Alini, Dublin, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 872 days.

(21) Appl. No.: 14/520,499

(22) Filed: Oct. 22, 2014

(65) Prior Publication Data

US 2015/0035380 A1   Feb. 5, 2015

Related U.S. Application Data

(63) Continuation of application No. 13/169,364, filed on Jun. 27, 2011, now Pat. No. 8,890,368.

(51) Int. Cl.
*H01F 27/42* (2006.01)
*H01F 37/00* (2006.01)
(Continued)

(52) U.S. Cl.
CPC ......... *H01F 38/14* (2013.01); *H01L 23/5227* (2013.01); *H01L 23/645* (2013.01); *H02J 5/005* (2013.01); *H02J 50/12* (2016.02); *H02J 50/80* (2016.02); *H01F 2019/085* (2013.01); *H01L 23/495* (2013.01); *H01L 2224/48247* (2013.01);
(Continued)

(58) Field of Classification Search
CPC .............. H02K 17/6874; H02K 17/691; H01F 17/006; H01F 2019/085; H03B 5/1228; H03B 5/1296; H01L 23/5227; H01L 23/645; H01L 2924/30107; H02J 5/005; H02J 50/80; H02J 50/12
See application file for complete search history.

(56) References Cited

U.S. PATENT DOCUMENTS 6,873,065 B2   3/2005   Haigh et al.
7,489,526 B2   2/2009   Chen et al.
(Continued)

OTHER PUBLICATIONS

Office Action dated Feb. 28, 2014 from the China Patent Office for Chinese Patent Application No. 201210214819.9.

*Primary Examiner* — Rexford Barnie
*Assistant Examiner* — Rasem Mourad

(57) ABSTRACT

An integrated circuit (IC) includes a first resonator circuit that includes: a first switching device that connects and disconnects a supply voltage to and from a first node; a first inductor that is connected between the first node and a first ground potential; and a second inductor that is connected between the first node and the first ground potential. The IC also includes a second resonator circuit that includes: a third inductor that is inductively coupled to the first inductor across an isolation barrier and that is connected between a second node and a second ground potential; a fourth inductor that is inductively coupled to the second inductor across the isolation barrier and that is connected between the second node and the second ground potential; and a second switching device that connects and disconnects the second node to and from a load. The second ground potential is different than the first ground potential.

19 Claims, 17 Drawing Sheets

(51) Int. Cl.
*H01F 38/00* (2006.01)
*H01F 38/14* (2006.01)
*H02J 50/80* (2016.01)
*H02J 50/12* (2016.01)
*H01L 23/522* (2006.01)
*H01L 23/64* (2006.01)
*H02J 5/00* (2016.01)
*H01L 23/495* (2006.01)
*H01F 19/08* (2006.01)

(52) U.S. Cl.
CPC .............. *H01L 2224/49171* (2013.01); *H01L 2924/30107* (2013.01)

(56) References Cited

U.S. PATENT DOCUMENTS

| | | | |
|---|---|---|---|
| 7,548,440 B2 | 6/2009 | Chen et al. | |
| 7,558,080 B2 | 7/2009 | Chen et al. | |
| 7,613,016 B2 | 11/2009 | Chen et al. | |
| 7,706,154 B2 | 4/2010 | Chen et al. | |
| 8,035,255 B2 | 10/2011 | Kurs et al. | |
| 8,044,733 B1* | 10/2011 | Arora | H03B 5/1243 331/117 FE |
| 8,218,340 B2* | 7/2012 | Sato | H02M 1/08 323/303 |
| 2004/0066241 A1* | 4/2004 | Gierkink | H03B 27/00 331/46 |
| 2004/0178857 A1* | 9/2004 | Jacobsson | H03B 5/1231 331/117 R |
| 2006/0120115 A1* | 6/2006 | Chen | H02M 3/33523 363/17 |
| 2006/0261902 A1* | 11/2006 | Masuda | H03B 5/1231 331/36 C |
| 2007/0132521 A1* | 6/2007 | Lee | H03B 5/1231 331/167 |
| 2007/0247237 A1* | 10/2007 | Mohammadi | H03B 5/1228 331/36 C |
| 2009/0091960 A1 | 4/2009 | Yang | |
| 2010/0052630 A1* | 3/2010 | Chen | H01F 27/2804 323/247 |
| 2011/0018646 A1 | 1/2011 | Lee et al. | |
| 2011/0043294 A1* | 2/2011 | Knoblinger | H03B 5/1228 331/117 FE |
| 2012/0326773 A1 | 12/2012 | Posat et al. | |

\* cited by examiner

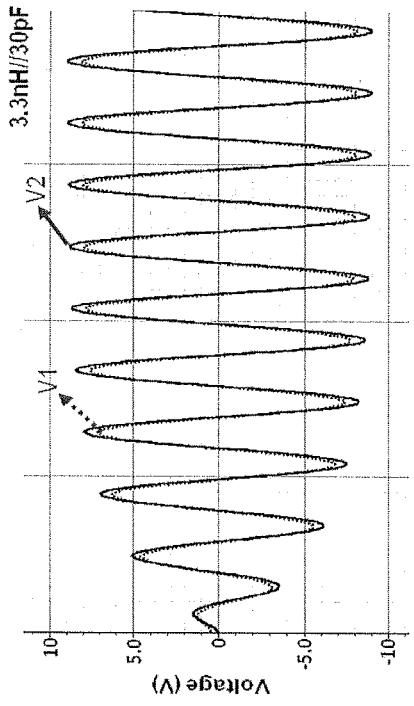
FIG. 6B
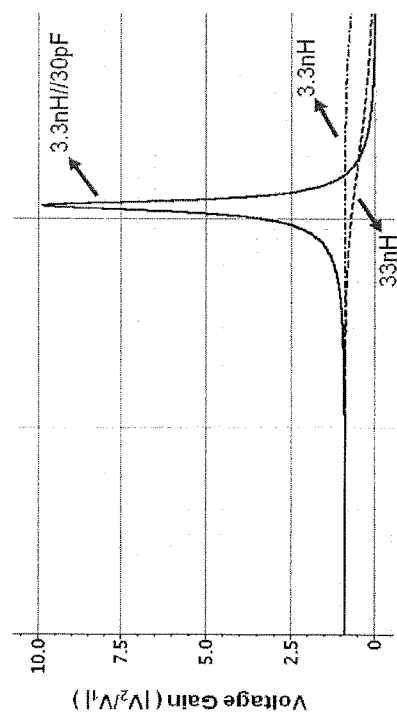
FIG. 6A
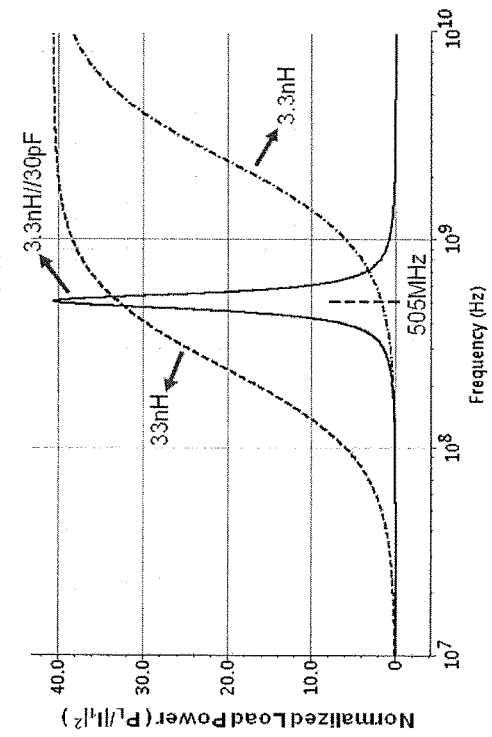
FIG. 6D
FIG. 6C

SYSTEMS AND METHODS FOR POWER TRANSFER BASED ON RESONANCE COUPLING OF INDUCTORS

CROSS-REFERENCE TO RELATED APPLICATIONS

The present disclosure is a continuation of U.S. patent application Ser. No. 13/169,364 filed on Jun. 27, 2011. The entire disclosure of the application referenced above is incorporated herein by reference.

FIELD

The present disclosure relates to integrated circuits (ICs) and more particularly to systems and methods for power transfer based on resonance coupling of inductors.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

FIG. 1 illustrates an example system that includes an integrated circuit (IC) 120 powered by a power supply 110. For example, the power supply 110 may generate a voltage ($V_{DDA}$) having a predetermined magnitude. The voltage $V_{DDA}$ may be supplied to each of a first circuit 130 and a second circuit 140 of the IC 120. However, due to system requirements the first and second circuits 130, 140 may be connected to separate grounds $GND_A$ and $GND_B$, respectively. The potential difference between the grounds $GND_A$ and $GND_B$, however, may occasionally spike, such as due to environmental factors. A voltage spike generally refers to an increase in the magnitude of a voltage across the second circuit 140 (e.g., $VDD_A$–$GND_B$) by more than an expected amount. The magnitude of the voltage spike may be very large (e.g., in the order of kilovolts, or kV) and therefore may damage the IC 120.

Some circuits, however, may require isolation for safety reasons. More specifically, some circuits may control safety-related parameters and therefore may require isolation from the power supply to prevent damage due to voltage spikes. For example only, the second circuit 140 may require isolation. Therefore, isolation barriers may be implemented to isolate a circuit from a power supply. The isolated circuit (e.g., the second circuit 140), however, still requires power.

SUMMARY

In a feature, an integrated circuit (IC) includes a first resonator circuit that includes: a first switching device that connects and disconnects a supply voltage to and from a first node; a first inductor that is connected between the first node and a first ground potential; and a second inductor that is connected between the first node and the first ground potential. The IC also includes a second resonator circuit that includes: a third inductor that is inductively coupled to the first inductor across an isolation barrier and that is connected between a second node and a second ground potential, wherein the second ground potential is different than the first ground potential; a fourth inductor that is inductively coupled to the second inductor across the isolation barrier and that is connected between the second node and the second ground potential; and a second switching device that connects and disconnects the second node to and from a load.

In a feature, an IC includes a first resonator circuit that receives a supply voltage at a first node and that includes: a switching device connected between the first node and a first ground potential; a first inductor that is connected between the first node and the first ground potential; and a second inductor that is connected between the first node and the first ground potential. The IC also includes a second resonator circuit that outputs power to a load and that includes: a third inductor that is inductively coupled to the first inductor across an isolation barrier and that is connected to a second ground potential, wherein the second ground potential is different than the first ground potential; and a fourth inductor that is inductively coupled to the second inductor across the isolation barrier and that is connected to the second ground potential.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 6A-6D are plots illustrating frequency response and transient response of the example systems of FIGS. 5A-5B;

DETAILED DESCRIPTION

Figure 1:
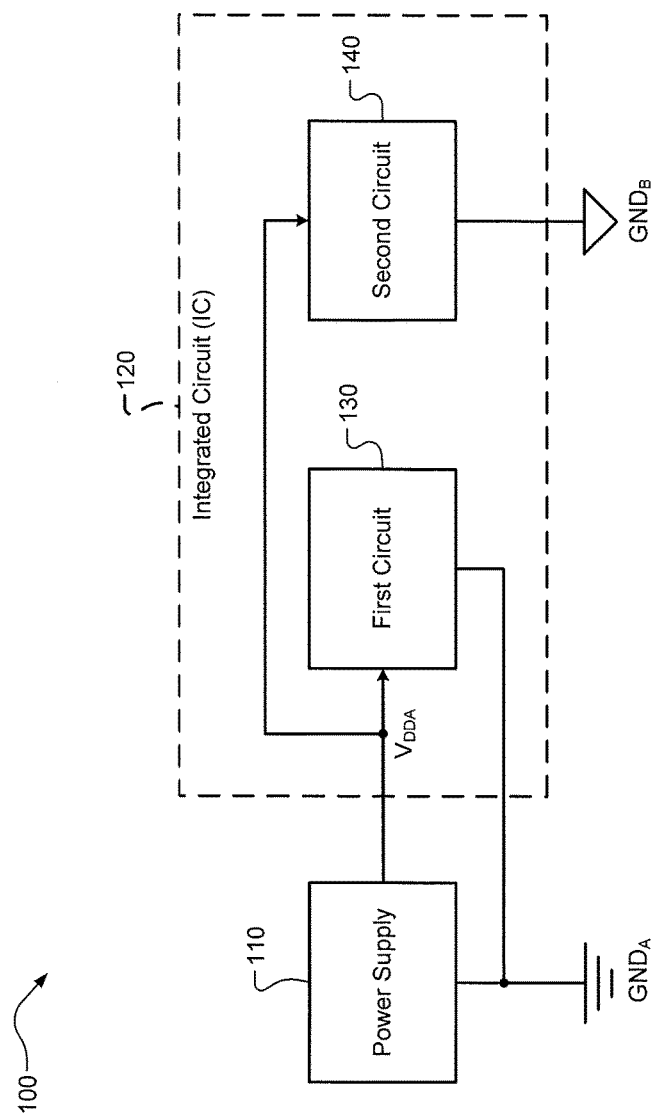
FIG. 1 is a functional block diagram of an example integrated circuit (IC) having first and second circuits according to the prior art.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors or a group of execution engines. For example, multiple cores and/or multiple threads of a processor may be considered to be execution engines. In various implementations, execution engines may be grouped across a processor, across multiple processors, and across processors in multiple locations, such as multiple servers in a parallel processing arrangement. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Figure 2:
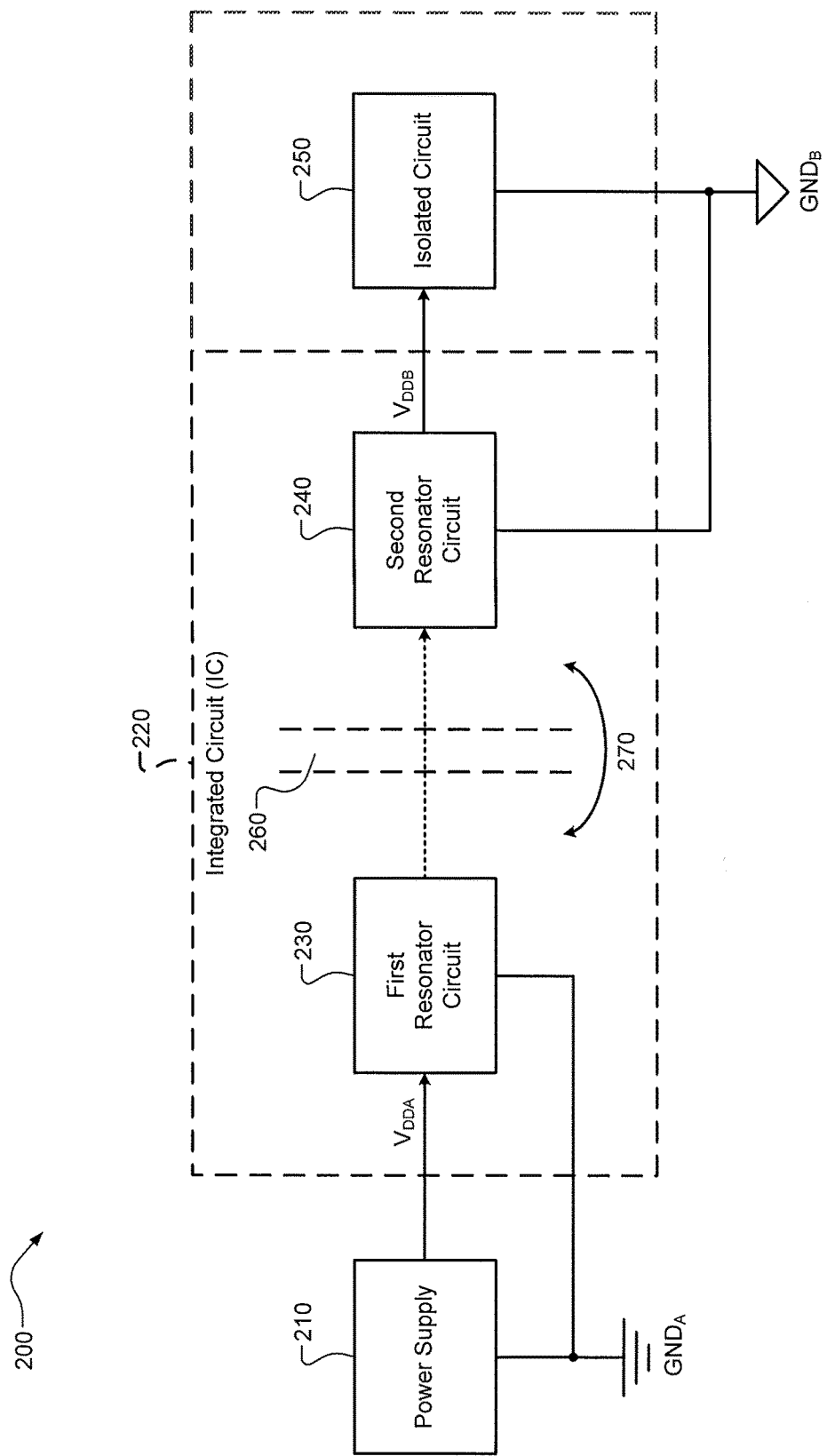
FIG. 2 is a functional block diagram of an example IC having a circuit isolated from a power source by an isolation barrier and first and second resonator circuits for transferring power across the isolation barrier to the isolated circuit.

Power transfer systems may provide for transfer of power across isolation barriers using coupled inductors. FIG. 2 illustrates an example system 200 that implements power transfer across an isolation barrier. The system 200 includes a power supply 210 that generates a voltage ($V_{ADA}$) that powers an integrated circuit (IC) 220. The IC 220 further includes a first resonator circuit 230, a second resonator circuit 240, and an isolated circuit 250. The isolated circuit 250, however, may also be located externally from the IC 220 (e.g., such as on another IC). The second resonator circuit 240 and the isolated circuit 250 are separated from the first resonator circuit 230 and the power supply 210 by an isolation barrier 260. The first resonator circuit 230 and the second resonator circuit 240, therefore, may collectively represent the power transfer system. For example only, the isolation barrier 260 may include a combination of silicon dioxide ($SiO_2$) and/or other materials such as polymers.

An inductive coupling coefficient (k) 270 represents a strength of inductive coupling between the first resonator circuit 230 and the second resonator circuit 240. The inductive coupling coefficient 270 may be based on a variety of parameters including, but not limited to, the composition of the isolation barrier 260 (i.e., magnetic permeability of the isolation barrier 260). For example, a ferrite core isolation barrier may have a stronger (i.e., tighter) inductive coupling whereas an air core or $SiO_2$ core isolation barrier may have a weaker (i.e., looser) inductive coupling. More specifically, but for example only, loose inductive coupling may refer to inductive coupling coefficients of approximately $k \leq 0.5$, whereas tight inductive coupling may refer to inductive coupling coefficients of approximately $k \geq 0.8$.

The first resonator circuit 230 may selectively transfer power across the isolation barrier 260 to the second resonator circuit 240. More specifically, the first resonator circuit 230 may include a first inductor that is magnetically coupled to a second inductor of the second resonator circuit 240. The first and second inductors may collectively represent a transformer. When current is supplied to the first inductor via the first resonator circuit, a magnetic field is created which causes current to flow through the second inductor and the second resonator circuit 240. A transferred voltage ($V_{DDB}$), however, may be less than the supply voltage $V_{DDA}$. Therefore, larger components (i.e., inductors) may be implemented to increase the magnitude of the transferred voltage $V_{DDB}$ towards the supply voltage $V_{DDA}$. Implementing larger components, however, is costly and increases area.

Accordingly, systems and methods for power transfer based on resonance coupling of inductors are presented. The systems and methods may provide for power transfer across an isolation barrier via inductors that are coupled at approximately a resonance frequency. Specifically, resonance coupling may provide for larger voltage gain and load power while implementing smaller components (i.e., inductors). Moreover, the inductors may be loosely coupled while still providing smaller transmission loss (i.e., $V_{DDB} \sim V_{DDA}$). A first system is directed to achieving resonance coupling by implementing matched first and second resonator circuits. For example, the matched first and second resonator circuits may each have a first layout and/or may each be implemented in a first metal layer of an IC. Alternatively, for example, the first and second resonator circuits may be stacked (i.e., overlayed) in different metal layers of an IC. A second system and a method are directed to achieving resonance coupling by tuning at least one of (i) a capacitance of a first resonator circuit and (ii) a switching frequency of the first resonator circuit, based on isolated feedback from a second resonator circuit.

Figure 3A:
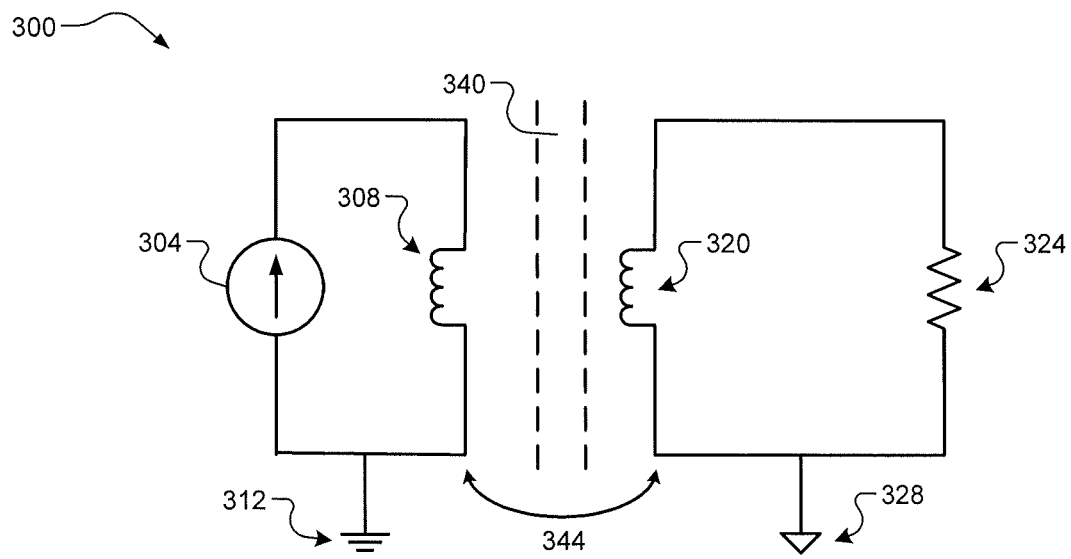
FIGS. 3A-3B are example power transfer systems having loosely coupled inductors according to one implementation of the present disclosure.

Referring now to FIG. 3A, an example power transfer system 300 is shown. The system 300 includes a current supply 304 that generates a current ($I_1$). A first node of a first inductor 308 is connected to a first node of the current supply 304 and receives the current $I_1$. A voltage ($V_1$) represents a voltage at the first node of the first inductor 308 and the first node of the current supply 304. For example only, the first inductor 308 may have an inductance of 33 nanoHenries (nH). A second node of the first inductor 308 is connected to a first ground (GND) and to a second node of the current supply 304. A first node of a second inductor 320 is connected to a first node of a resistor 324. The first inductor 308 and the second inductor 320 may collectively represent a transformer having a primary winding (the first inductor 308) and a secondary winding (the second inductor 320).

A voltage ($V_2$) indicates a voltage at the first node of the second inductor 320 and the first node of the resistor 324. For example only, the second inductor 320 may have an inductance of 33 nH and the resistor 324 may have a resistance of 50 Ohms ($\Omega$). A second node of the resistor 324 is connected to a second ground 328 and to a second node of the second inductor 320. The second inductor 320 is separated from the first inductor 308 by an isolation barrier 340. The first and second inductors 308, 320 are loosely coupled by an inductive coupling coefficient 344. For example only, the inductive coupling coefficient 344 may be approximately 0.2 (i.e., k~0.2).

Figure 3B:
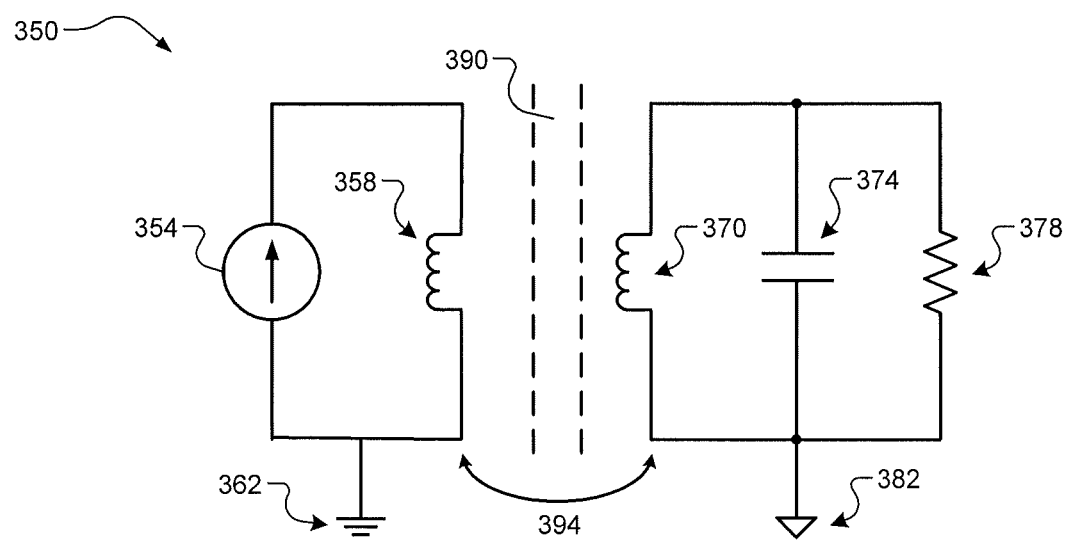

Referring now to FIG. 3B, an example power transfer system 350 based on resonance coupling is shown. The system 350 includes a current supply 354 that generates a current ($I_1$). A first node of a first inductor 358 is connected to a first node of the current supply 354 and receives the current $I_1$. A voltage ($V_1$) represents a voltage at the first node of the first inductor 358 and the first node of the current supply 354. For example only, the first inductor 358 may have an inductance of 3.3 nH. A second node of the first inductor 358 is connected to a first ground (GND) and to a second node of the current supply 354. A first node of a second inductor 370 is connected to a first node of a resistor 378 and to a first node of a resonance capacitor 374. The first inductor 358 and the second inductor 370 may collectively represent a transformer having a primary winding (first inductor 358) and a secondary winding (second inductor 370).

A voltage ($V_2$) indicates a voltage at the first node of the second inductor 320, the first node of the resistor 378, and the first node of the resonance capacitor 374. For example only, the second inductor 370 may have an inductance of 3.3 nH, the resistor 378 may have a resistance of 50$\Omega$, and the resonance capacitor 374 may have a capacitance of 30 picoFarads (pF). A second node of the resistor 378 and a second node of the resonance capacitor 374 are each connected to a second ground 382 and to a second node of the second inductor 370. The second inductor 370 is separated from the first inductor 358 by an isolation barrier 390. The first and second inductors 358, 370 are loosely coupled by an inductive coupling coefficient 394. For example only, the inductive coupling coefficient 394 may be approximately 0.2 (i.e., k~0.2).

Figure 4A:
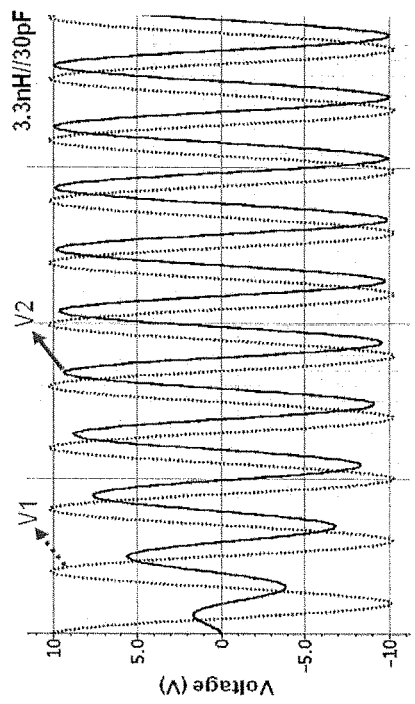
FIGS. 4A-4D are plots illustrating frequency response and transient response of the example systems of FIGS. 3A-3B.

Referring now to FIGS. 4A-4D, plots of simulated frequency response and simulated transient response are shown for both power transfer systems 300 and 350 of FIGS. 3A and 3B, respectively. FIG. 4A illustrates voltage gain ($V_2/V_1$) at various frequencies ranging from $10^7$ Hertz (Hz) to $10^{10}$ Hz. As shown, the system 300 of FIG. 3A (33 nH) does not achieve a voltage gain of greater than 0.20 (i.e., equal to the inductive coupling coefficient). Similarly, the system 350 of FIG. 3B without the resonance capacitor 374 (3.3 nH) does not achieve a voltage gain of greater than 0.2.

Figure 4B:
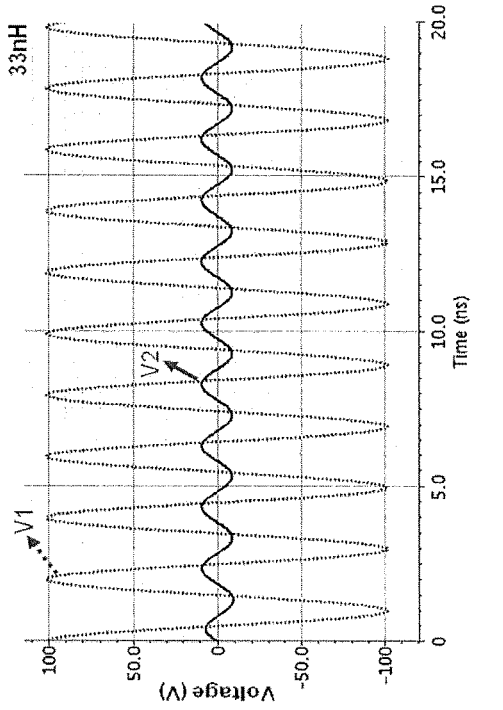

The system 350 of FIG. 3B including the resonance capacitor 374 (3.3 nH/30 pF), however, achieves a voltage gain of almost 1.0 at a frequency of 505 megahertz (MHz) (i.e., approximately the resonance frequency). Therefore, larger voltage gains can be achieved using smaller (i.e., 10% sized) inductors. In addition, FIG. 4B illustrates voltage transient response during a period of 25 nanoseconds (ns). As shown, the system 350 of FIG. 3B (including the resonance capacitor 374 and operating at approximately the resonance frequency) achieves a full voltage transfer (~10V) after 4-5 cycles.

Figure 4C:
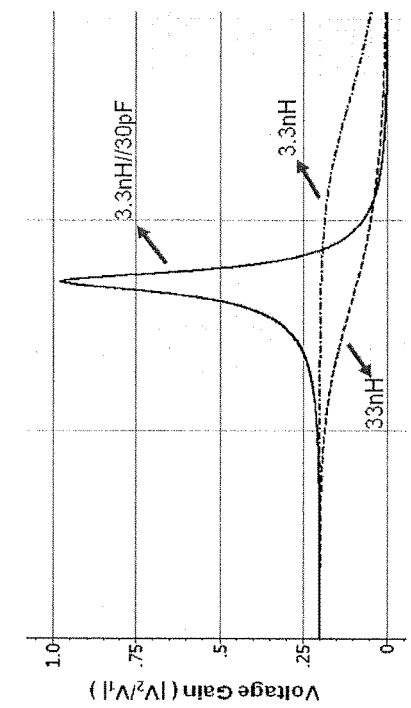
Figure 4D:
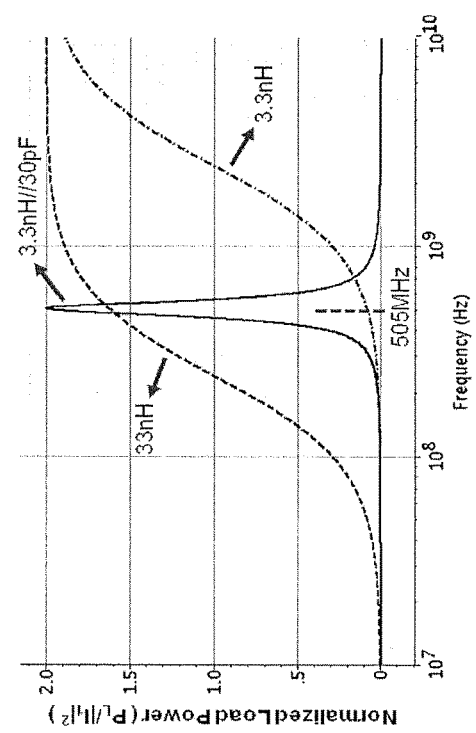

Referring now to FIG. 4C, normalized load power ($P_L/|I_1|^2$) is shown for the same frequency range as FIG. 4A ($10^7$ Hz to $10^{10}$ Hz). As shown, the system 300 of FIG. 3A (33 nH) achieves larger normalized load powers at lower frequencies and achieves a maximum normalized load power (~2.0) at approximately $10^9$ Hz. In contrast, the system 350 of FIG. 3B without the resonance capacitor 374 (3.3 nH) requires higher frequencies to achieve larger normalized load powers and requires a frequency of approximately $10^{10}$ Hz to achieve the maximum normalized load power (i.e., 10 times the frequency of the system 300 of FIG. 3A (33 nH). In addition, as shown in FIG. 4D, the system 300 of FIG. 3A (33 nH) requires approximately 100 V (at $V_1$) to transfer the desired 10V (at $V_2$), which is impractical.

The system 350 of FIG. 3B including the resonance capacitor 374 (3.3 nH/30 pF), however, achieves the maximum load power at 505 MHz (i.e., approximately the resonance frequency), which is less than the frequency required by the system 300 of FIG. 3A (33 nH) to achieve the maximum load power (~$10^9$ Hz). Moreover, the system 350 of FIG. 3B (including the resonance capacitor 374 and operating at approximately the resonance frequency) is capable of achieving the maximum load power at a lower frequency while implementing smaller (10% sized) inductors.

Figure 5A:
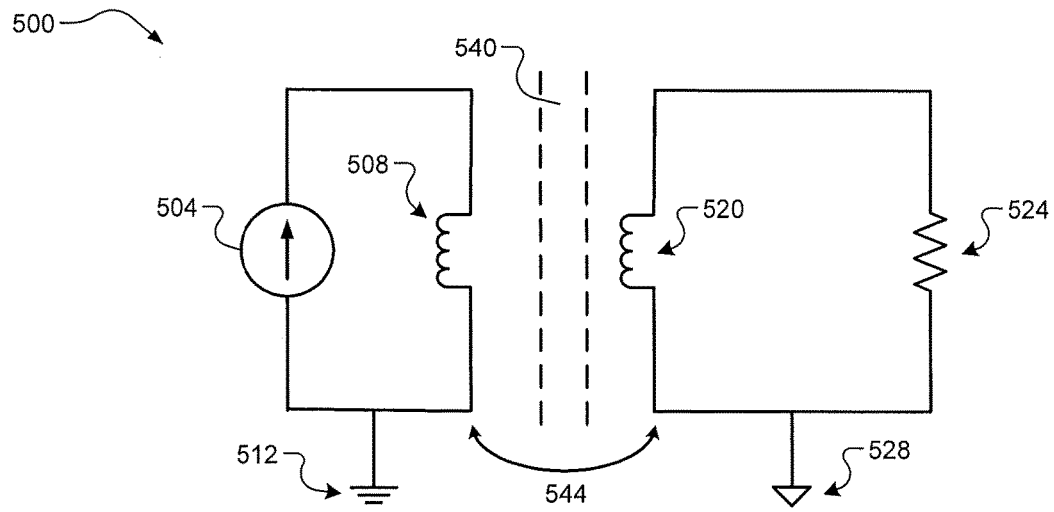
FIGS. 5A-5B are example power transfer systems having tightly coupled inductors according to one implementation of the present disclosure.
Figure 5B:
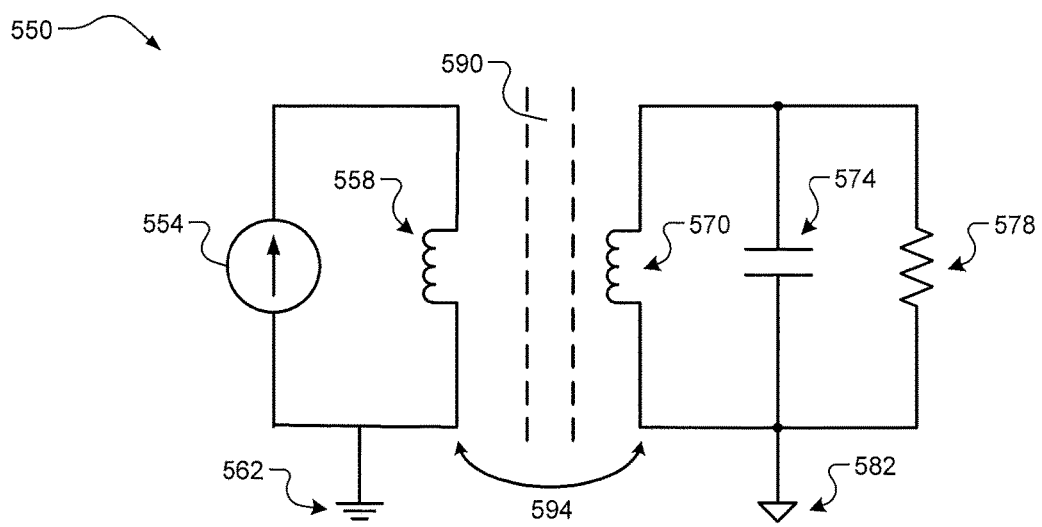

Referring now to FIGS. 5A-5B, examples of power transfer systems are shown having tightly coupled inductors. FIG. 5A illustrates an example power transfer system 500. The system 500 includes a current supply 504 that generates a current ($I_1$). A first node of a first inductor 508 is connected to a first node of the current supply 504 and receives the current $I_1$. A voltage ($V_1$) represents a voltage at the first node of the first inductor 508 and the first node of the current supply 504. For example only, the first inductor 508 may have an inductance of 33 nH. A second node of the first inductor 508 is connected to a first ground (GND) and to a second node of the current supply 504. A first node of a second inductor 520 is connected to a first node of a resistor 524. The first inductor 508 and the second inductor 520 may collectively represent a transformer having a primary winding (the first inductor 508) and a secondary winding (the second inductor 520).

A voltage ($V_2$) indicates a voltage at the first node of the second inductor 520 and the first node of the resistor 524. For example only, the second inductor 520 may have an inductance of 33 nH and the resistor 524 may have a resistance of 50$\Omega$. A second node of the resistor 524 is connected to a second ground 528 and to a second node of the second inductor 520. The second inductor 520 is separated from the first inductor 508 by an isolation barrier 540. The first and second inductors 508, 520 are tightly coupled by an inductive coupling coefficient 544. For example only, the inductive coupling coefficient 544 may be approximately 0.9 (i.e., k~0.9).

Referring now to FIG. 5B, an example power transfer system 550 based on resonance coupling is shown. The system 550 includes a current supply 554 that generates a current ($I_1$). A first node of a first inductor 558 is connected to a first node of the current supply 554 and receives the current $I_1$. A voltage ($V_1$) represents a voltage at the first node of the first inductor 558 and the first node of the current supply 554. For example only, the first inductor 558 may have an inductance of 3.3 nH. A second node of the first inductor 558 is connected to a first ground (GND) and to a second node of the current supply 554. A first node of a second inductor 570 is connected to a first node of a resistor 578 and to a first node of a resonance capacitor 574. The first inductor 558 and the second inductor 570 may collectively represent a transformer having a primary winding (the first inductor 558) and a secondary winding (the second inductor 570).

A voltage ($V_2$) indicates a voltage at the first node of the second inductor 520, the first node of the resistor 578, and the first node of the resonance capacitor 574. For example only, the second inductor 570 may have an inductance of 3.3 nH, the resistor 578 may have a resistance of 50Ω, and the resonance capacitor 574 may have a capacitance of 30 pF. A second node of the resistor 578 and a second node of the resonance capacitor 574 are each connected to a second ground 582 and to a second node of the second inductor 570. The second inductor 570 is separated from the first inductor 558 by an isolation barrier 590. The first and second inductors 558, 570 are tightly coupled by an inductive coupling coefficient 594. For example only, the inductive coupling coefficient 594 may be approximately 0.9 (i.e., k~0.9).

Referring now to FIGS. 6A-6D, plots of simulated frequency response and simulated transient response are shown for power transfer systems 500 and 550 of FIGS. 5A and 5B, respectively. FIG. 6A illustrates voltage gain ($V_2/V_1$) at various frequencies ranging from $10^7$ Hertz (Hz) to $10^{10}$ Hz. As shown, the system 500 of FIG. 5A (33 nH) does not achieve a voltage gain of greater than 0.9 (i.e., equal to the inductive coupling coefficient). Similarly, the system 550 of FIG. 5B without the resonance capacitor 574 (3.3 nH) does not achieve a voltage gain of greater than 0.9.

The system 550 of FIG. 5B including the resonance capacitor 574 (3.3 nH/30 pF), however, achieves a voltage gain of almost 10 at a frequency of 505 MHz (i.e., approximately the resonance frequency). Therefore, larger voltage gains can be achieved and moreover smaller (i.e., 10% sized) inductors may be implemented. In addition, FIG. 6B illustrates voltage transient response during a period of 25 ns. As shown, the system 550 of FIG. 5B (including the resonance capacitor 574 and operating at approximately the resonance frequency) achieves a full voltage transfer (~10V) after 4-5 cycles.

Referring now to FIG. 6C, normalized load power ($P_L/|I_1|^2$) is shown for the same frequency range as FIG. 5A ($10^7$ Hz to $10^{10}$ Hz). As shown, the system 500 of FIG. 5A (33 nH) achieves larger normalized load powers at lower frequencies and achieves a maximum normalized load power (~40) at approximately $10^9$ Hz. In contrast, the system 550 of FIG. 5B without the resonance capacitor 574 (3.3 nH) requires higher frequencies to achieve larger normalized load powers and requires a frequency of approximately $10^{10}$ Hz to achieve the maximum normalized load power (i.e., 10 times the frequency of the system 500 of FIG. 5A (33 nH).

The system 550 of FIG. 5B including the resonance capacitor 574 (3.3 nH/30 pF), however, achieves the maximum load power at 505 MHz (i.e., approximately the resonance frequency), which is less than the frequency required by the system 500 of FIG. 5A (33 nH) to achieve the maximum load power (~$10^9$ Hz). In addition, as shown in FIG. 6D, while the tightly-coupled system 500 of FIG. 5A (33 nH) does not require a higher voltage (at $V_1$) to achieve the desired 10V (at $V_2$), the system 550 of FIG. 5B (including the resonance capacitor 574) can still achieve the same performance while implementing smaller (10% sized) inductors.

While resonance coupling may be more beneficial in the case of loosely (i.e, weakly) coupled inductors, resonance coupling also offers additional advantages in the case of tightly (i.e., strongly) coupled inductors. First, gate capacitance of transistors in the first and second resonator circuits, respectively, decreases energy when the transistors are switching; however, resonance coupling provides for this energy to be recycled with the energy stored in the inductors, thereby reducing switching losses that rapidly grows as switching frequency increases. Second, the transistors normally switch on/off at a voltage across the transistors of approximately 0V; however, resonance coupling provides for a simple high frequency solution to this zero voltage switching (ZVS) condition thereby improving overall efficiency. Third, for in-phase operation with resonance coupling, because the first and second resonator circuits are in-phase, the total energy stores in the system and this a quality factor of the transformer(s) increases, thereby increasing efficiency, particularly when the coupling coefficient is high. Lastly, resonance coupling provides for rectification without using diodes in the second resonance circuit, thereby increasing efficiency, eliminating voltage drops, and decreasing area/cost.

Figure 7A:
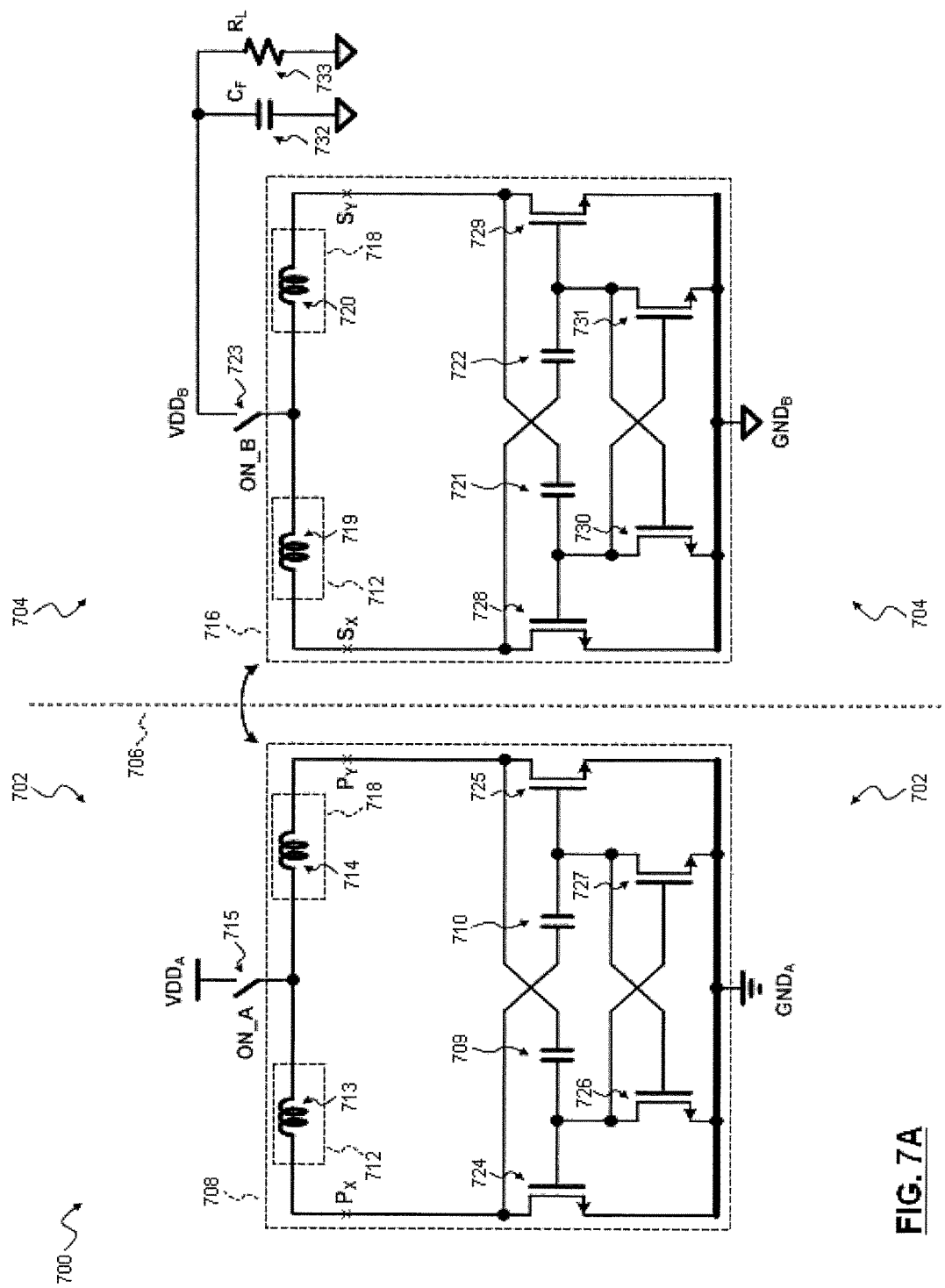
FIG. 7A is a circuit diagram of an example power transfer system according to another implementation of the present disclosure.

Referring now to FIG. 7A, an example power transfer system 700 is shown. The system 700 includes a first resonator circuit 702 and a second resonator circuit 704. The first and second resonator circuits 702 and 704, respectively, are divided by an isolation barrier 706. For example only, the isolation barrier 706 may include $SiO_2$ and/or a polymer thereby giving the isolation barrier 706 a high breakdown voltage (e.g., approximately 5 kV). The first resonator circuit 702 includes an inductor-capacitor (LC) tank 708 that includes capacitors ($C_P$) 709, 710 and inductors 713, 714. The LC tank 708 is selectively connected to a supply voltage ($VDD_A$) via a switch (e.g., transistor) 715 controlled by a first signal (ON_A). The first signal ON_A may be a pulse-width modulated (PWM) control signal that selectively charges the first LC tank 708. Alternatively, the first signal ON_A may be a power-on signal. The first resonator circuit 702 may also be referred to as a "primary circuit" because the first resonator circuit 702 receives the supply voltage $VDD_A$. Similarly, capacitors $C_P$ 709, 710 may also be referred to as a "primary capacitors," and voltages at ends of the inductors 713, 714 ($P_X$ and $P_Y$, respectively) may also be referred to as "primary voltages."

The second resonator circuit 704 includes a second LC tank 716 that includes inductors 719, 720 and coupling capacitors ($C_C$) 721, 722. Inductors 713 and 719 may collectively represent a first transformer 712. Similarly, inductors 714 and 720 may collectively represent a second transformer 718. The pairs of inductors 713, 719 and 714, 720, respectively (i.e., transformers 712 and 718), may each be implemented in a same layer of an IC or a same area of an IC to increase coupling (configurations described in detail later). The first and second transformers 712 and 718 may be implemented side-by-side on an IC, but far enough apart to minimize coupling between the transformers. For example only, the following die configurations may be used: (1) two separate dies for the first and second resonator circuits, with the transformers implemented as part of one of the two dies or (2) three separate dies for each of the first resonator circuit, the second resonator circuit, and the transformers.

The first resonator circuit 702 may transfer power across the isolation barrier 706 to the second resonator circuit 704 via the first transformer 712 and/or the second transformer 718. Similar to the first resonator circuit 702, the second resonator circuit 704 may also be referred to as a "secondary circuit," the coupling capacitors $C_C$ 721, 722 may also be referred to as a "secondary capacitors," and voltages at ends of the inductors 719, 720 ($S_X$ and $S_Y$, respectively) may also be referred to as "secondary voltages." The second LC tank 716 is selectively connected to supply an output voltage ($VDD_B$) to an output load via a switch 723 (e.g., a transistor) controlled by a second signal (ON_B) for selectively discharging the second LC tank 716. Similar to the first signal ON_A, the second signal ON_B may be a PWM signal (e.g., having a same frequency as ON_A), a power-on signal, or the second signal ON_B (and switch 723) may be eliminated thereby having the second resonator circuit 704 receive power so long as the first resonator circuit 702 is on.

In addition to the capacitors $C_P$ 709, 710 and inductors 713, 714, the first LC tank 708 may further include a first plurality of transistors 724, 725, 726, and 727, respectively (collectively first transistors 724-727). While the first LC tank 708 is shown to include the first transistors 724-727, some of the first transistors 724-727 (e.g., 726-727) may be located separately from the first LC tank 708. Transistors 724-725, however, should be included as part of the first LC tank 708 because their gates contribute to the overall resonance capacitance of the first LC tank 708. Similar to the first LC tank 708, in addition to the capacitors $C_C$ 721, 722 and inductors 719, 720, the second LC tank 716 may further include a second plurality of transistors 728, 729, 730, and 731, respectively (collectively second transistors 728-731). While the second LC tank 716 is shown to include the second transistors 728-731, some of the second transistors 728-731 (e.g., 730-731) may be located separately from the second LC tank 716. Transistors 728-729, however, should be included as part of the second LC tank 716 because their gates contribute to an overall resonance capacitance of the second LC tank 716. Lastly, the output voltage $VDD_B$ at the output load may be filtered by a filter capacitor 732 connected in parallel to a load resistor 733.

Figure 7B:
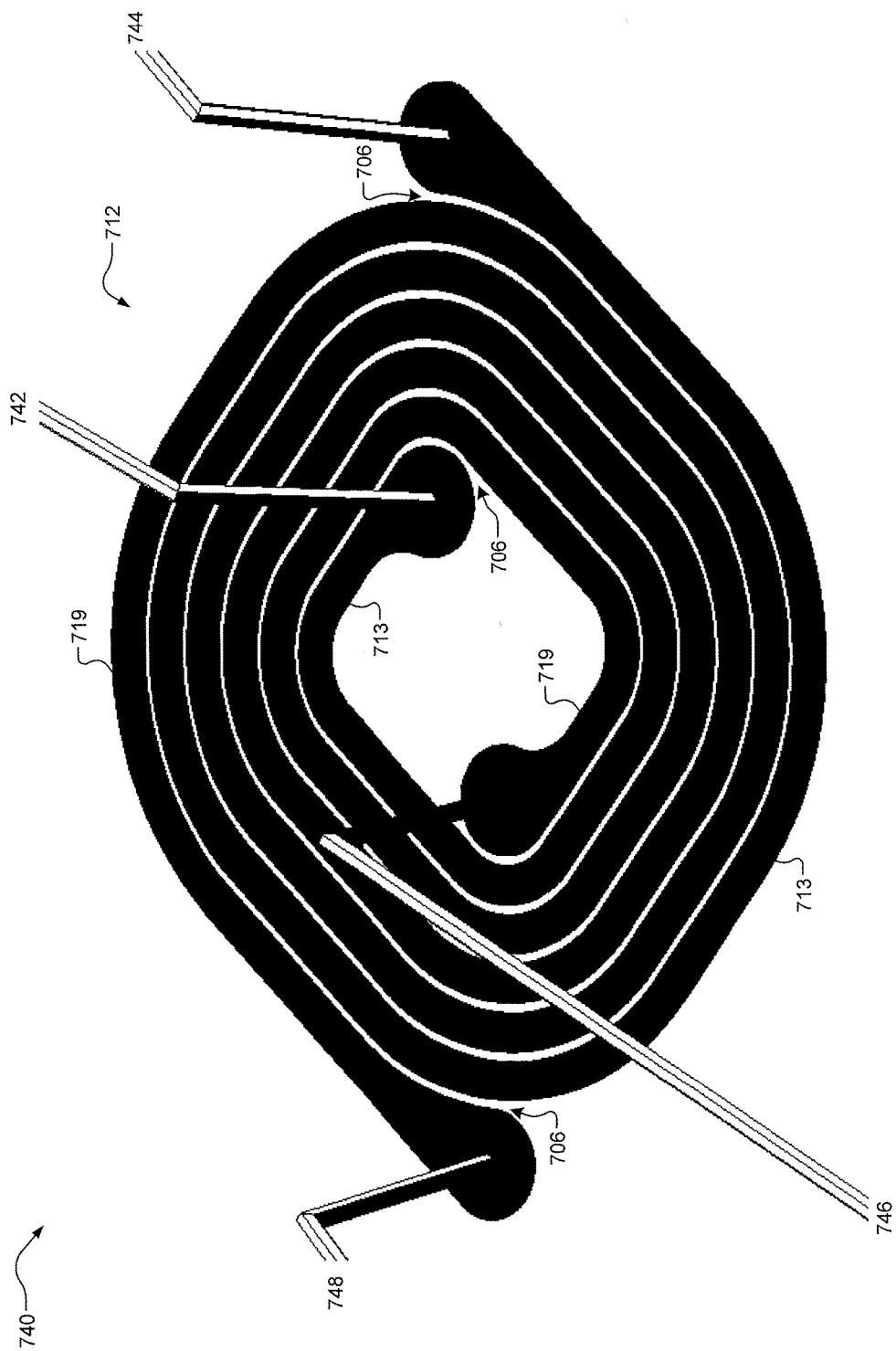
FIG. 7B illustrates a first example configuration of coupled inductors according to one implementation of the present disclosure.

Referring now to FIG. 7B, a first example configuration 740 for transformer 712 of FIG. 7A is shown. While transformer 712 of FIG. 7A is shown, the first example configuration 740 may also apply to other transformers described herein, such as transformer 718 of FIG. 7A or other transformers described later. This configuration 740 may be also be referred to as a planar configuration or a "Frlan" configuration monolithic transformer. More specifically, both inductor 713 and inductor 719 of transformer 712 may be implemented in the same plane on an IC. In other words, both inductor 713 and inductor 719 may be implemented in the same metal layer on the IC. The isolation barrier 706 includes an SiO2 and/or polymer based dielectric located laterally between windings of the inductors 713 and 719. Inductor 713 includes nodes 742 and 744 and inductor 719 includes nodes 746 and 748. For example only, current may flow through inductor 713 from node 742 to 744, thereby causing current to flow through inductor 719 in the direction from node 746 to 748.

The planar configuration 740 provides for symmetry for the windings thereby improving matching of the corresponding first and second resonator circuits 702 and 704, respectively. Therefore, when resonance coupled, this configuration 740 provides for elimination of both rectifying diodes and tuning due to the matched resonator circuits 702 and 704. In addition, implementation in a single, thick metal layer may decrease costs. However, implementing specific turn-ratios (i.e., for step-up or step-down transformers) may be difficult. Furthermore, the coupling coefficient between the inductors 713 and 719 may be weak.

Figure 7C:
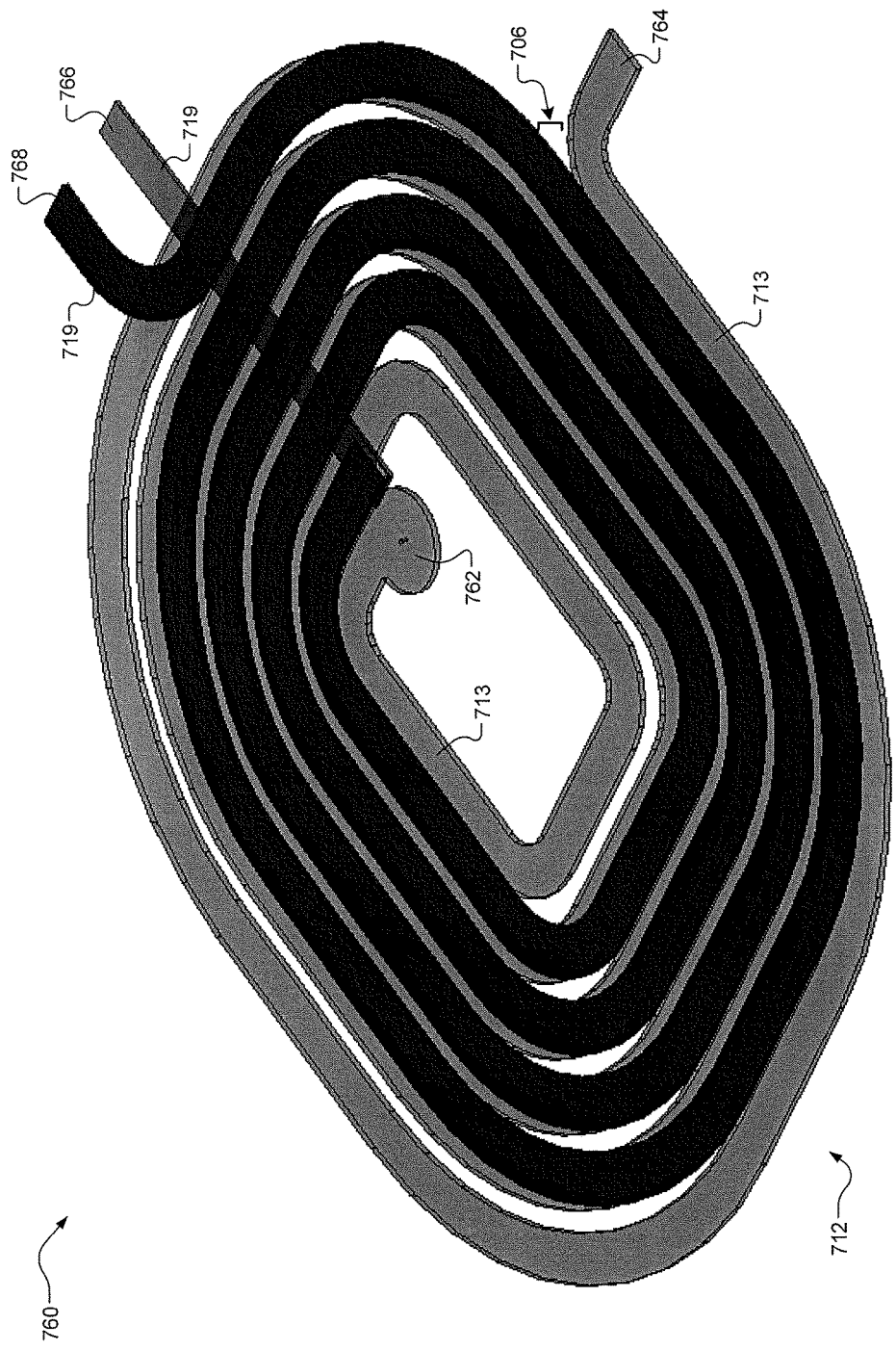
FIG. 7C illustrates a second example configuration of coupled inductors according to another implementation of the present disclosure.

Referring now to FIG. 7C, a second example configuration 760 for transformer 712 of FIG. 7A is shown. While transformer 712 of FIG. 7A is shown, the second example configuration 760 may also apply to other transformers described herein, such as transformer 718 of FIG. 7A or other transformers described later. This configuration 760 may also be referred to as an overlay configuration or a "Finlay" configuration monolithic transformer. More specifically, inductor 713 and inductor 719 of transformer 712 may be overlayed on an IC. In other words, inductor 713 and inductor 719 may be implemented in a same area on the IC but on different planes. The isolation barrier 706 includes an SiO2 and/or polymer based dielectric located vertically between the inductors 713 and 719. Therefore, the coupling coefficient between the inductors 713 and 719 may be strong. Inductor 713 includes nodes 762 and 764 and inductor 719 includes nodes 766 and 768. For example only, current may flow through inductor 713 from node 762 to 764, thereby causing current to flow through inductor 719 in the direction from node 766 to 768.

The overlay configuration 760 provides for easy implementation of specific turn-ratios (i.e., for step-up or step-down transformers). Implementing a step-up or step-down transformer allows for recovery of a voltage drop at the output load due to transformer losses. For example only, a step-up transformer may be implemented in the matched resonator system thereby achieving an output (i.e., transferred) voltage equal to the input (i.e., supply) voltage. Alternatively, when a step-up transformer is implemented, the first resonator circuit 702 may be tuned by adding a fixed value resonance capacitor or using a capacitive tuning method (described in detail later).

Figure 7D:
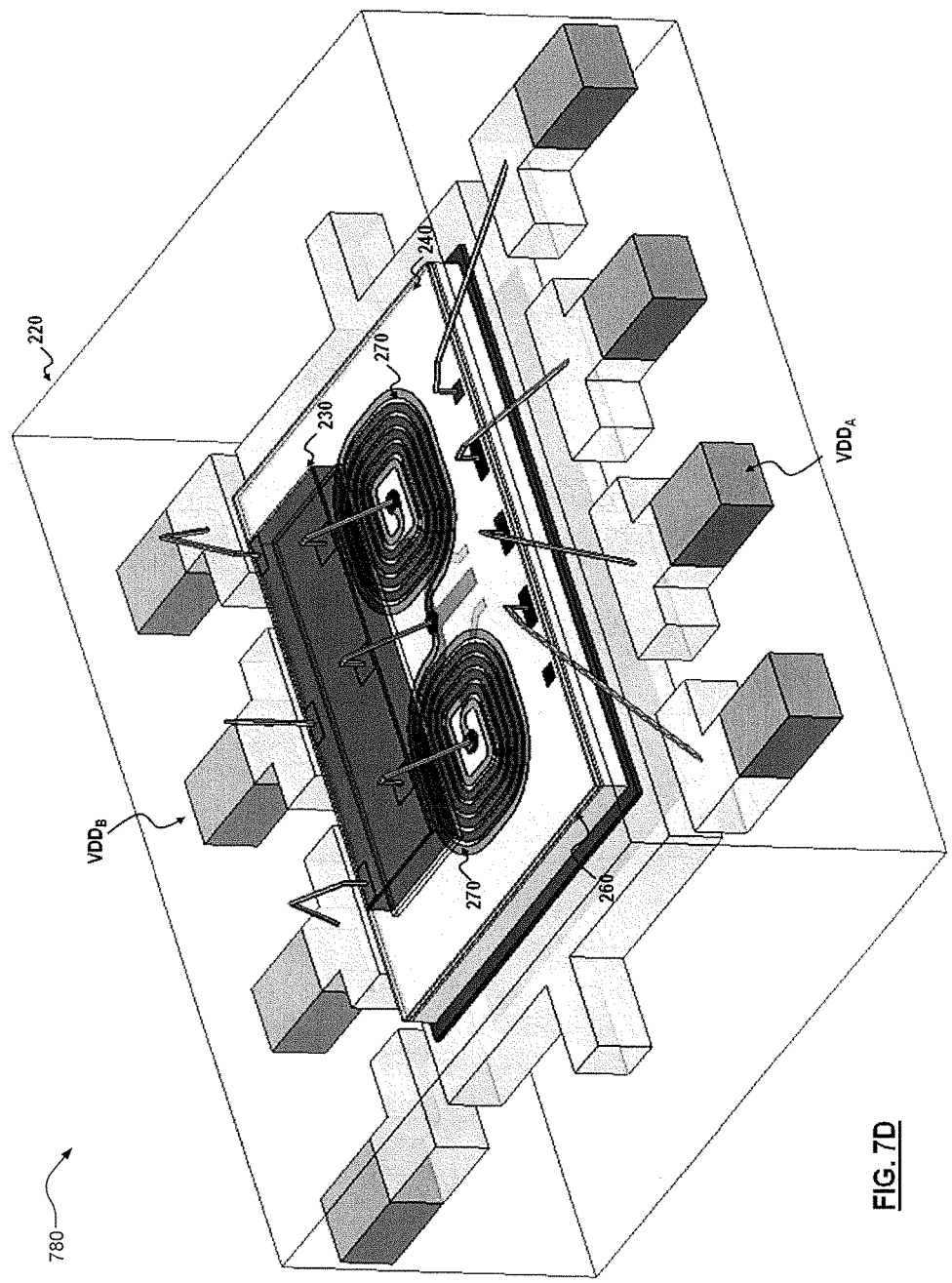
FIG. 7D illustrates an example configuration of the example IC of FIG. 2 including two pairs of coupled inductors each having the second example configuration of FIG. 7C.

Referring now to FIG. 7D, an example configuration 780 of the IC 220 of FIG. 2 is shown including two pairs of coupled inductors having the configuration 760 of FIG. 7C. As shown, the IC 220 includes first and second resonator circuits 230 and 240, respectively, that transfer power across an isolation barrier 260 to an isolation circuit (not shown), the first and second resonator circuits 230 and 240 having inductively coupled via a coefficient 270 and further including the two pairs of coupled inductors (each having the overlay configuration of FIG. 7C).

Figure 8A:
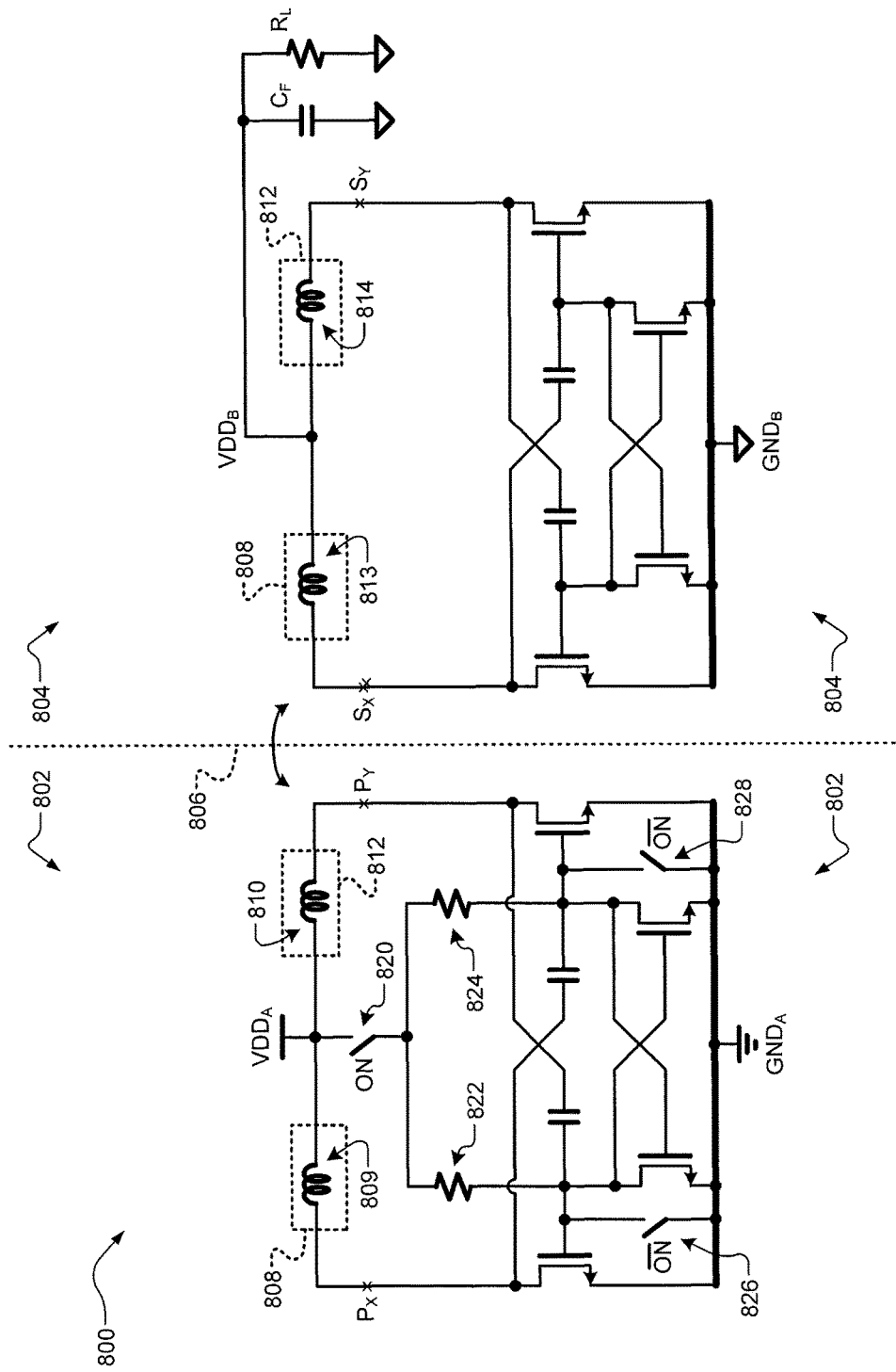
FIGS. 8A-8C are example power transfer systems according to other implementations of the present disclosure.
Figure 8B:
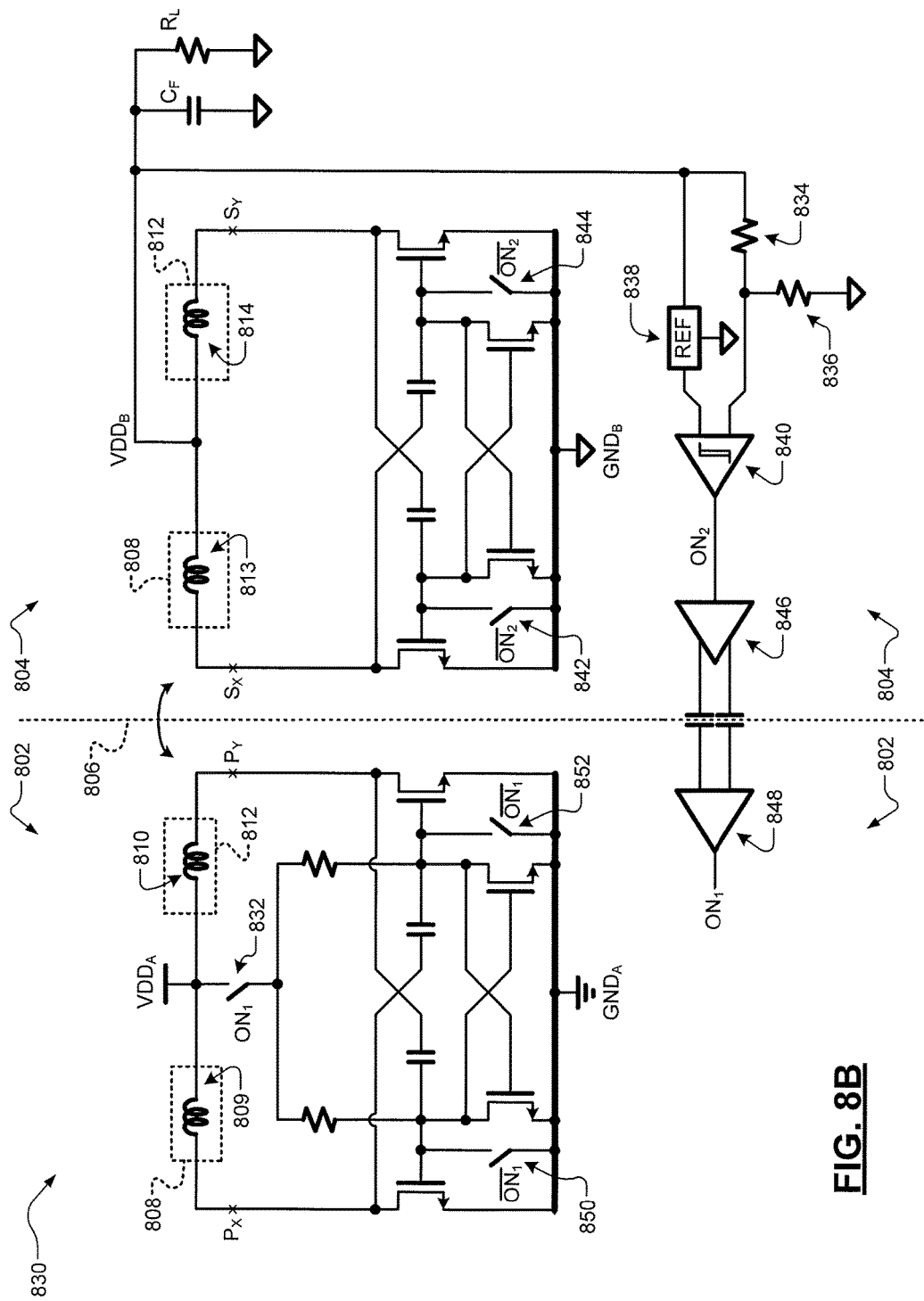
Figure 8C:
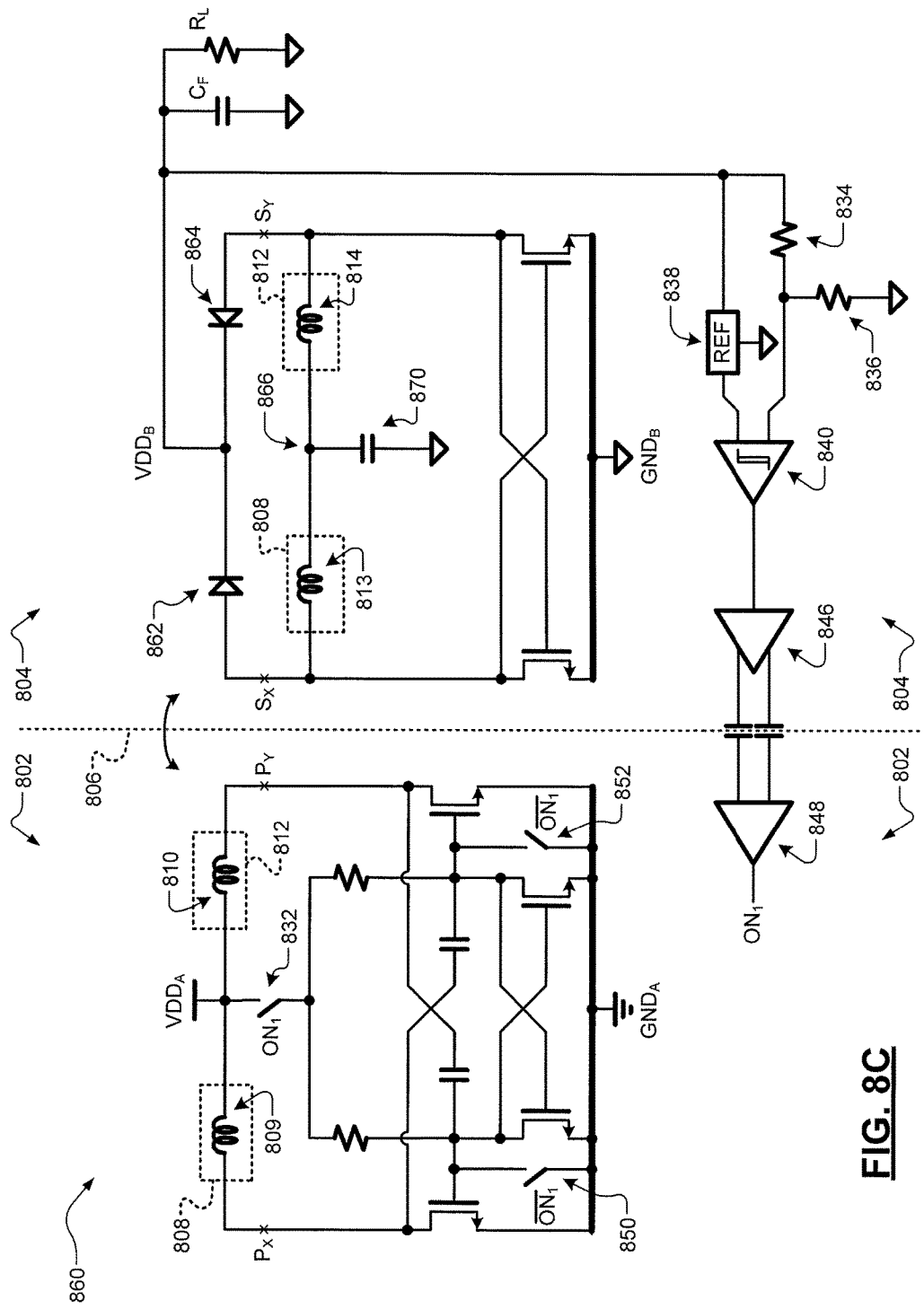

Referring now to FIGS. 8A-8C, alternative examples of the power transfer system 700 of FIG. 7A are shown. First, FIG. 8A illustrates an example power transfer system 800 that eliminates transistors 715 and 723 and the first and second signals ON_A and ON_B. Similar to the system 700 of FIG. 7A, system 800 includes first and second resonator circuits 802 and 804, respectively. The first and second resonator circuits 802 and 804, respectively, are separated by an isolation barrier 806. The first resonator circuit 802 includes inductors 809 and 810, and the second resonator circuit 804 includes inductors 813 and 814. Inductors 809 and 813 collectively represent a first transformer 808 and inductors 810 and 814 collectively represent a second transformer 812.

However, in contrast to system 700 of FIG. 7A, supply voltage $VDD_A$ is directly connected to a node between inductors 809 and 810 and the output voltage $VDD_B$ is drawn from a node between inductors 813 and 814. Additionally, a switch 820 is connected to resistors 822 and 824 which are connected to the LC tank of the first resonator circuit 802. Therefore, the first resonator circuit 802 is turned on and off by pulling up/down gates of transistors 826 and 828 of the LC tank via transistor 820. Capacitive coupling at the gates of the cross-coupled devices enables the usage of this on/off scheme. Efficiency is significantly improved by eliminating the switch transistors out of the supply current path. The second resonator circuit 804, on the other hand, is always on and receives power as long as the first resonator circuit 802 is on. The output voltage $VDD_B$ is unregulated and in the case of a one-to-one transformer may be slightly lower than the input voltage $VDD_A$, with voltage drops being a function of load current and resonator losses. In the case of a step-up transformer, however, the output voltage $V_{DDB}$ can be regulated at a level greater than or equal to the input voltage $V_{DDA}$ by a linear low drop out regulator (LDO). In this case, output voltage $V_{DDB}$ can be kept constant for any load current.

Referring now to FIG. 8B, another example power transfer system 830 is shown. The system 830 is similar to system 800 of FIG. 8A such that transistors 715 and 723 and first and second signals ON_A and ON_B have been eliminated and the first resonator circuit 802 is turned on/off via switch (e.g., transistor) 832. Transistor 832 is controlled by an isolated feedback signal ($ON_1$). In other words, system 830 differs because it further includes isolated feedback. More specifically, the output voltage $VDD_B$ is passed through a voltage divider (resistors 834 and 836) and compared to a reference voltage REF 838 using a regulator circuit 840. For example, the regulator circuit 840 may be a hysteretic comparator. The output of the hysteretic comparator 840 is another signal ($ON_2$), the compliment of which is used to control switches 842 and 844 in the LC tank of the second resonator circuit 804.

A transmitter 846 also receives the output of the hysteretic comparator 840 (signal $ON_2$). The transmitter 846 transmits signal $ON_2$ across isolation barrier 806 to a receiver 848. The receiver 848 then sends the received signal (isolated feedback signal $ON_1$) to the first resonator circuit 802. As previously described, the isolated feedback signal $ON_1$ controls on/off switching of the first resonator circuit 802 via transistor 832. In addition, the compliment of the isolated feedback signal $ON_1$ is used to control switches 850 and 852 in the LC tank of the first resonator circuit 802. Therefore, the output voltage $VDD_B$ swings between two thresholds of the hysteretic comparator 840. For example, in the case of a one-to-one transformer 812, the output voltage $VDD_B$ may be regulated at a level less than the input voltage $VDD_A$ due to practical losses of a monolithic transformer. However, in the case of a step-up transformer, the output voltage $VDD_B$ may be regulated at a level greater than or equal to the input voltage $VDD_A$.

Referring now to FIG. 8C, another example power transfer system 860 is shown. The system 860 is similar to system 830 of FIG. 8B such that transistors 715 and 723 and first and second signals ON_A and ON_B have been eliminated and the first resonator circuit 802 is turned on/off via transistor 832, which is controlled by isolated feedback signal $ON_1$. However, system 860 differs because the output voltage $VDD_B$ is rectified by diodes 862 and 864 instead of being taken from a node between inductors 813 and 814. In addition, bypass capacitor 870 is connected at the node between inductors 813 and 814. Bypass capacitor 870 forms an alternating current (AC) ground at a common node of 813 and 814, thereby isolating the flow of 813 and 814.

For example, in the case of a one-to-one transformer, because the secondary peak voltages ($S_X$, $S_Y$) exceed the input voltage (e.g., by approximately a factor of three), the output voltage $VDD_B$ is able to be rectified to achieve a magnitude equal to the input voltage $VDD_A$. The diodes 862 and 864 effectively clamp the voltage swing and limit maximum drain and gate voltages across the cross-coupled transistors of the LC tank of the second resonator circuit 804. Therefore, low voltage transistors may be implemented without any capacitive coupling (i.e., voltage division) at the gate. The cross-coupled devices form the second resonator circuit 804 and also provide synchronous rectification by increasing the secondary voltage swing above ground. Therefore, a positive direct current (DC) voltage is established and maintained across bypass capacitor 870. As shown, system 860 further includes isolated feedback similar to system 830 of FIG. 8B. As a result, system 860 is capable of achieving an output voltage $VDD_B$ equal to the input voltage $VDD_A$ in both the cases of a one-to-one transformer and a step-down transformer.

Figure 9A:
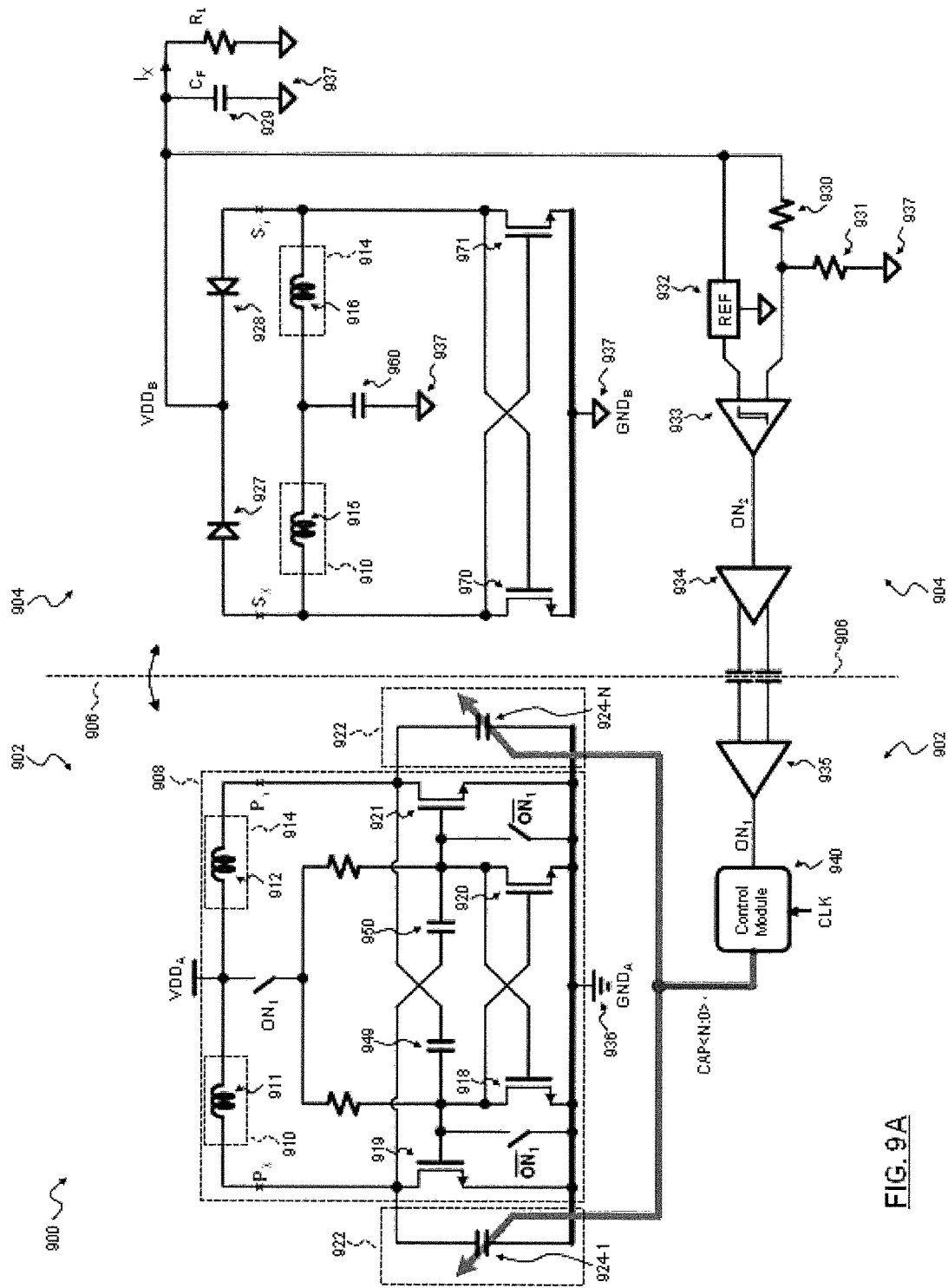
FIG. 9A is a circuit diagram of an example power transfer system having isolated feedback according to one implementation of the present disclosure.

Feedback-based tuning may also be applied to power transfer systems that do not include matched resonator circuits. For example, FIG. 9A illustrates an example power transfer system 900 having feedback-based tuning. The system 900 includes first and second resonator circuits 902 and 904, respectively. The first and second resonator circuits 902 and 904, respectively, are separated by an isolation barrier 906. The first resonator circuit 902 includes an LC tank 908 that includes primary capacitors ($C_P$) 949, 950 and inductors 911 and 912. The LC tank 908 is directly connected to a supply voltage ($VDD_A$) at a node between inductors 911 and 912, as well as to a first ground ($GND_A$) 936.

The second resonator circuit 904 includes inductors 915 and 916, rectifier diodes 927 and 928, bypass capacitor 960, and cross-coupled devices 970 and 971, that function the same way as described with respect to the second resonator circuit 804 (see FIG. 8C). The second resonator circuit 904 is also connected to a second ground ($GND_B$) 937. Inductors 911 and 915 may collectively represent a first transformer 910. Inductors 912 and 916 may collectively represent a second transformer 914. In addition to the primary capacitors 949 and 950 and inductors 911 and 912, the LC tank 908 may further include a plurality of transistors 918, 919, 920, and 921, respectively (collectively transistors 918-921). While the LC tank 908 is shown to include the transistors 918-921, some of the transistors 918-921 (e.g., 918 and 920) may be located separate from the LC tank 908. The transistors 918-921 are used to control a frequency of charging/discharging the LC tank 908 and also together with the coupling capacitors 949 and 950 form the resonance capacitors of the LC tank 908.

The first resonator circuit 902 further includes a variable capacitor array 922. The variable capacitor array 922 includes N capacitors 924-1 . . . 924-N connected in series with primary capacitors $C_P$ 949 and 950 and parallel to the transistors 918-921. While two capacitors are shown (924-1 and 924-N), the variable capacitor array 922 may include additional capacitors (i.e., N≥2). The variable capacitor array 922 provides for selective adjustment of the capacitance of the first resonator circuit 902 (i.e., to a capacitance greater than or less than that of the capacitors $C_P$ 949 and 950).

The second resonator circuit 904 further includes diodes 927 and 928 connected to first and second nodes of the bypass capacitor 960 and in parallel to each other. The outputs of the diodes 927 and 928 are connected to an output node representing the output voltage ($VDD_B$). The output voltage $VDD_B$ may be used to power a load connected to the output node. A filter capacitor ($C_F$) 929 filters the output voltage $VDD_B$. Also connected to the output node are a reference voltage module 932 generating a reference voltage ($V_{REF}$) and a voltage divider including resistors 930 and 931 connected in series.

A regulator circuit 933 such as a hysteretic comparator compares the stepped-down voltage from the voltage divider and the reference voltage $V_{REF}$. The output of the hysteretic comparator 933 represents isolated feedback from the second resonator circuit 904 for use in controlling the first resonator circuit 902. A transmitter 934 transmits the feedback across the isolation barrier 906 to a receiver 935 of the primary circuit 902. The receiver 935 sends the feedback to a control module 940. Based on a clock signal (CLK) and the isolated feedback, the control module 940 controls at least one of (i) a switching frequency of the primary circuit 902 and (ii) a capacitance of the primary circuit 902. Note that the switching frequency of the primary circuit 902 is not the resonance frequency, and in fact the switching frequency is much lower than the resonance frequency. The switching frequency is used for regulating the output voltage $V_{DDB}$ in burst mode by setting the right on/off pulse width.

Figure 9B:
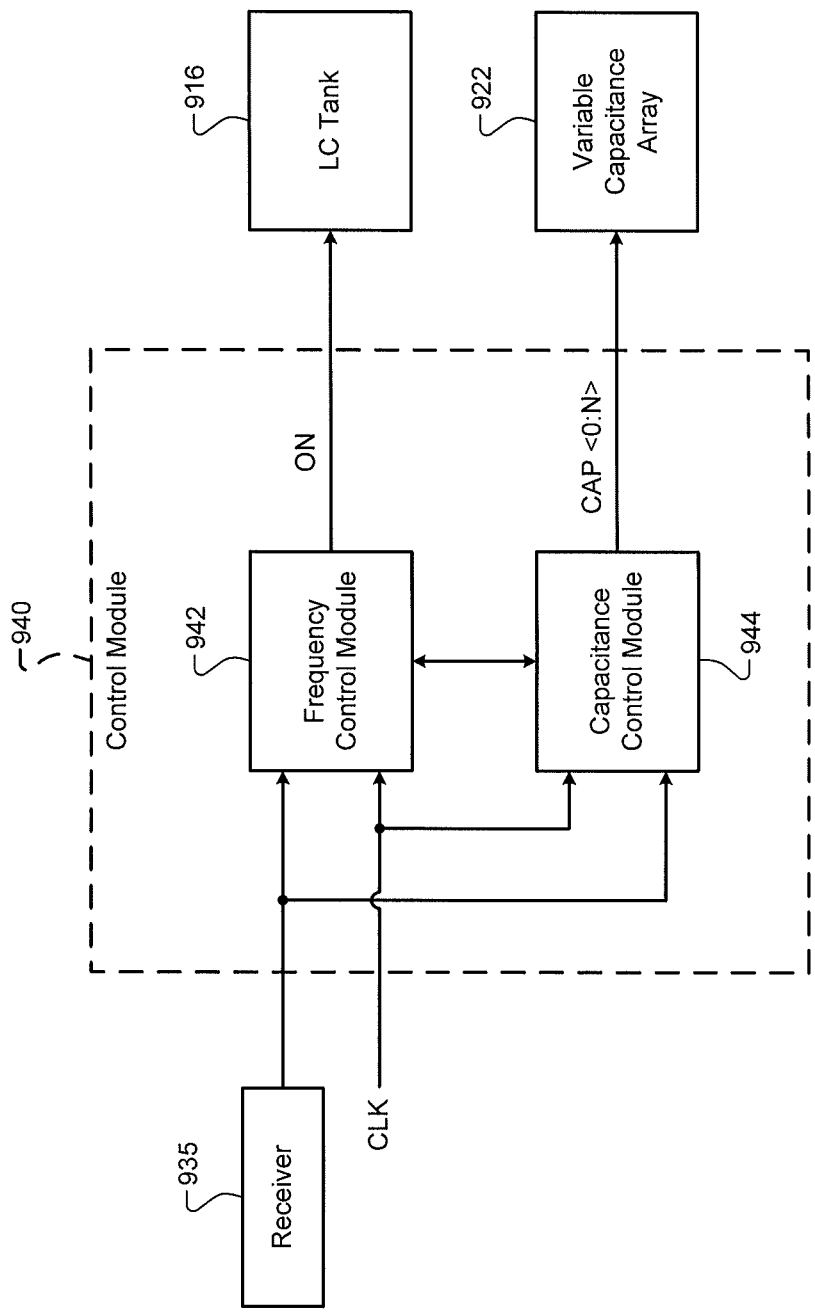
FIG. 9B is a functional block diagram of a control module of the power transfer system of FIG. 9A.

FIG. 9B illustrates an example of the control module 940. The control module 940 may include a frequency control module 942 and a capacitance control module 944. The frequency control module 942 selectively controls switching in the LC tank 908 (i.e., transistors 918-921). For example, the transistors 918-921 may be controlled via a signal ("ON"). The capacitance control module 944 selectively controls the capacitance adjustment by the variable capacitor array 922 to the capacitance of the primary capacitor $C_P$ 909. For example, the variable capacitor array 922 may be controlled via a bus signal ("CAP<N:0>") that connects/disconnects one of more of the capacitors in the variable capacitor array 922.

Both the frequency control module 942 and the capacitance control module 944 receive the clock signal CLK and the isolated feedback from the secondary circuit 904 (via receiver 935). Based on the clock signal CLK and the isolated feedback, the control module 940 may control at least one of (i) the LC tank 908 (i.e., switching of the transistors 918-921) and (ii) the variable capacitor array 922. For example, the frequency control module 942 and the capacitance control module 944 may communicate with each other to determine whether none, one, or both of (i) switching frequency adjustment and (ii) capacitance adjustment are required.

Figure 9C:
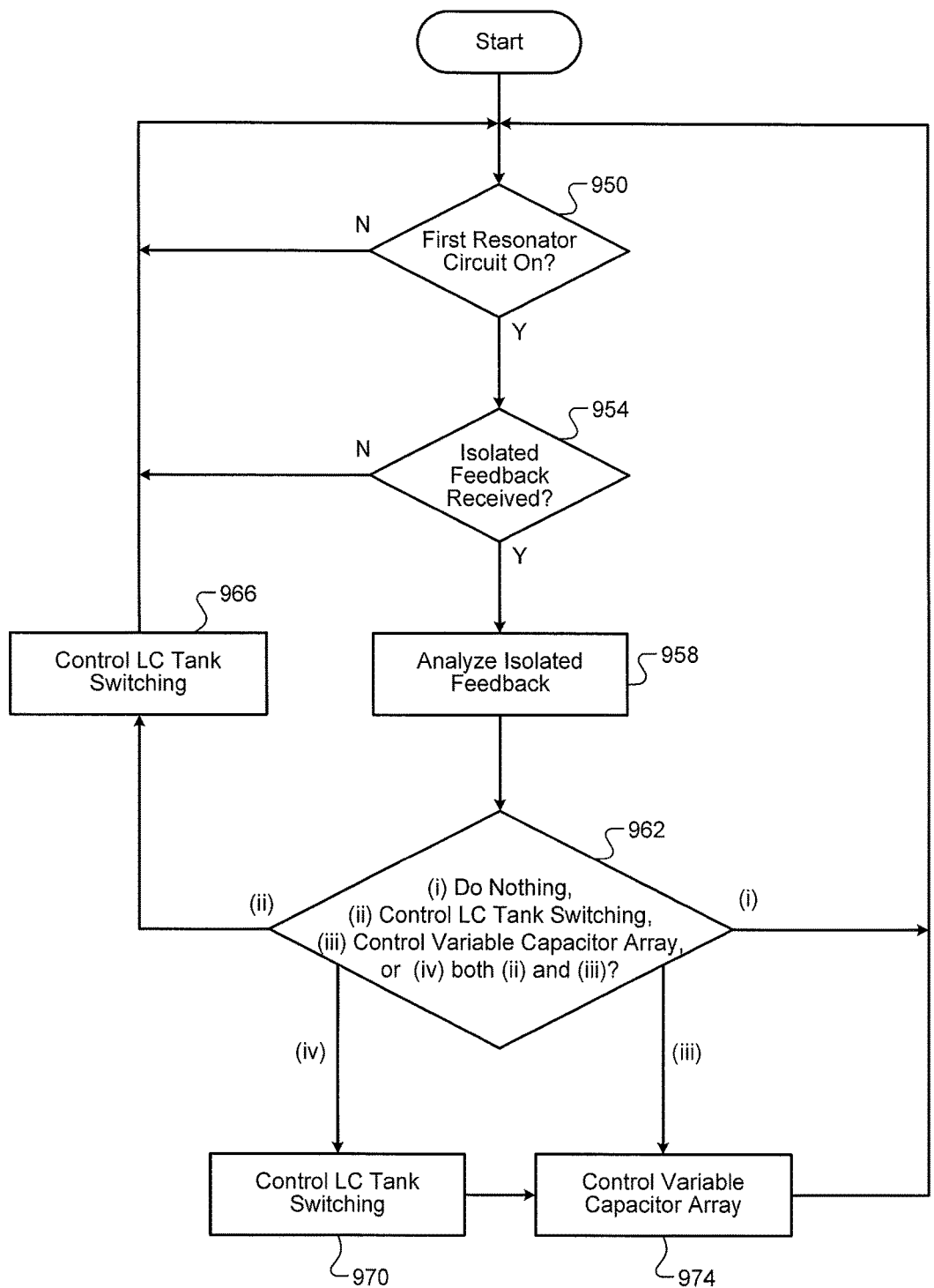
FIG. 9C is a flow diagram illustrating an example method of tuning the power transfer system of FIG. 9A.

Referring now to FIG. 9C, a flow diagram of a method for controlling the power transfer system 900 of FIG. 9A begins at 950. At 950, the control module 940 determines whether the first resonator circuit 902 is on. If true, control may proceed to 954. If false, control may return to 950. At 954, the control module 940 determines whether isolated feedback from hysteretic comparator 933 of the second resonator circuit 904 has been received (e.g., via transmitter 934 and receiver 935). If true, control may proceed to 958. If false, control may return to 950. In addition, the control module 940 also receives the clock signal CLK. At 958, the control module 940 analyzes the isolated feedback. For example, the control module 940 may compare the isolated feedback to one or more predetermined thresholds. At 962, the control module 940 determines whether to (i) do nothing, (ii) adjust the switching frequency of transistors 918-921, (iii) adjust the capacitance via variable capacitor array 922, or (iv) both adjust the switching frequency of transistors 918-921 and adjust the capacitance via variable capacitor array 922.

If (i), control may end (for the current loop) or return to 950. If (ii), control may proceed to 966. If (iv), control may proceed to 970. If (iii), control may proceed to 974. At 966, the control module 940 may adjust the switching frequency of transistors 918-921 based on the analysis of the isolated feedback. Control may then end (for the current loop) or return to 950. At 970, the control module 940 may adjust switching frequency of transistors 918-921 based on the analysis of the isolated feedback. At 974, the control module 940 may adjust the variable capacitor array 922 based on the analysis of the isolated feedback. For example, the control module 940 may connect and additional capacitor or disconnect a capacitor (i.e., N+1, or N−1). Control may then end (for the current loop) or return to 950.

Specifically, the isolated feedback may be one-bit of digital information and the primary resonator circuit is turned on when the isolated feedback (ON) has a first (i.e., high) state. The isolated feedback ON is identical to the output of a regulator circuit (e.g., hysteretic comparator 933) on the other side of the isolation barrier. The two thresholds of the regulator circuit are slightly higher and slightly lower (e.g., around 10 mV), respectively, than the reference voltage. The analysis of the isolated feedback ON is based on determining the duration of first (i.e., high) and second (i.e., low) states of the isolated feedback ON (i.e., the one-bit of information). Clock signal CLK is required to measure these durations by counting the clock CLK pulses between high-to-low and low-to-high transitions of the isolated feedback ON. Term X(n) may be referred to as a figure of merit for capacitor value optimization and corresponds to ($1/T_{ON}+1/T_{OFF}$). Therefore, for best accuracy, CLK should have sufficiently high frequency.

Figure 9D:
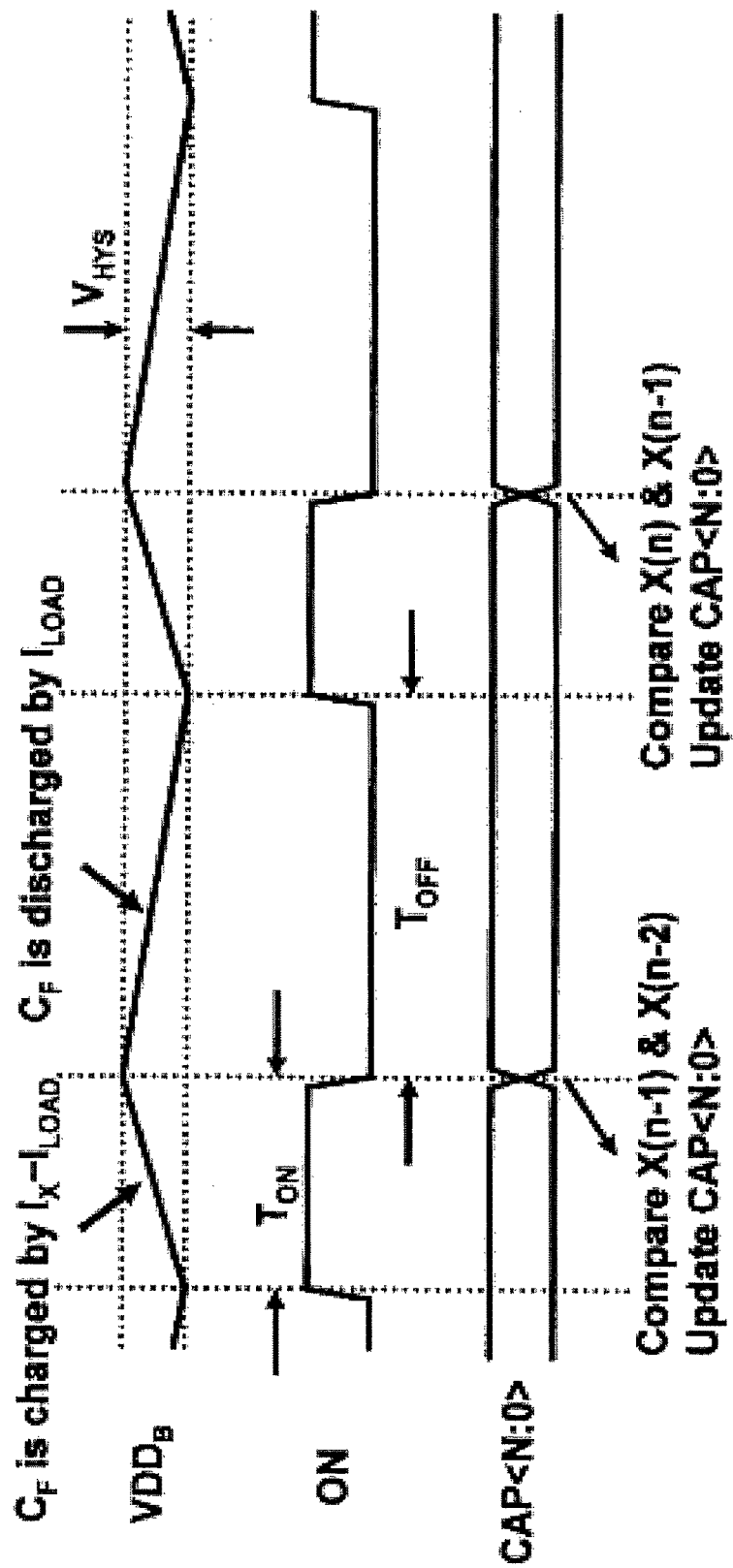
FIG. 9D is a plot illustrating simulated results of tuning the power transfer system of FIG. 9A.

Referring now to FIG. 9D, a timing diagram illustrates simulated results of tuning the power transfer system of FIG. 9A. A horizontal axis indicates time and a vertical axis indicates three parameters (from top to bottom): output voltage $VDD_B$, LC tank control signal ON, and variable capacitor array control bus CAP<N:0>. As shown, during a first on period ($T_{ON}$), capacitor $C_F$ 929 is charged (within limits corresponding to a hysteresis range $V_{HYS}$) by a difference between the output current $I_X$ and a current drawn by the load $I_{LOAD}$ ($I_X$−$I_{LOAD}$). Isolated feedback is generated and analyzed. Based on the analyzed isolated feedback, the control module 940 may (i) connect an additional capacitor from the variable capacitor array 922, (ii) disconnect a capacitor from the variable capacitor array 922, or (iii) do nothing.

During a first off period ($T_{OFF}$), capacitor $C_F$ 929 is discharged (within the limits corresponding to the hysteresis range $V_{HYS}$) by the current drawn by the load $I_{LOAD}$. During a second on period, capacitor $C_F$ 929 is again charged by a difference between the output current $I_X$ and the current drawn by the load $I_{LOAD}$ ($I_X$−$I_{LOAD}$). Isolated feedback is again generated and analyzed. Based on the analyzed isolated feedback, the control module 940 may again (i) connect an additional capacitor from the variable capacitor array 922, (ii) disconnect a capacitor from the variable capacitor array 922, or (iii) do nothing.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:
1. An integrated circuit (IC), comprising:
    a first resonator circuit that receives a supply voltage at a first node and that includes:
        a switching device connected between the first node and a first ground potential;

a first inductor that is connected between the first node and the first ground potential;
a second inductor that is connected between the first node and the first ground potential;
a first inductor capacitor (LC) tank; and
first and second resistors connected between the switching device and the LC tank;
a second resonator circuit that outputs power to a load and that includes:
a third inductor that is inductively coupled to the first inductor across an isolation barrier and that is connected to a second ground potential, wherein the second ground potential is different than the first ground potential;
a fourth inductor that is inductively coupled to the second inductor across the isolation barrier and that is connected to the second ground potential,
wherein the load draws power from a second node between the third and fourth inductors; and
a second LC tank including a plurality of switches;
a voltage divider that is connected to the second node; and
a regulator circuit that generates a signal based on a comparison of an output voltage of the voltage divider with a reference voltage,
wherein the plurality of switches of the second LC tank switch based on a state of the signal.

2. The IC of claim 1 further comprising two diodes that are connected in parallel with the third and fourth inductors, wherein the load draws power from a second node between the two diodes.

3. The IC of claim 1 further comprising:
a transmitter that transmits the signal across the isolation barrier; and
a receiver that receives the signal across the isolation barrier from the transmitter and that outputs a second signal based on the received signal,
wherein the switching device switches based on a state of the second signal.

4. The IC of claim 3 wherein switches of the first LC tank switch based on a complement of the second signal.

5. The IC of claim 1 further comprising a resistor and a capacitor that are connected to the second node between the third and fourth inductors.

6. The IC of claim 1 wherein a voltage output to the load has a magnitude that is less than or equal to the supply voltage.

7. The IC of claim 1 wherein:
the first inductor is implemented on a first layer of the IC;
the third inductor is implemented on a second layer of the IC; and
the first and second layers are different.

8. The IC of claim 1 wherein:
the first and third inductors are implemented on one layer of the IC; and
the IC includes a dielectric disposed between windings of the first and third inductors.

9. The IC of claim 1 further comprising the isolation barrier.

10. The IC of claim 1 wherein the second resonator circuit further includes a bypass capacitor that is connected between (i) the second ground potential and (ii) a second node between the third and fourth inductors.

11. The IC of claim 1 wherein:
the first LC tank comprises:
first and second capacitors; and
a plurality of switches that control a frequency of charging and discharging of the first LC tank; and
the first resonator circuit further includes a variable capacitor array connected in series with one of the first and second capacitors and in parallel with the plurality of switches.

12. The IC of claim 11 wherein the variable capacitor array is configured to adjust a first capacitance of the first resonator circuit to a value that is greater than a second capacitance of the first and second capacitors.

13. The IC of claim 11 wherein the variable capacitor array is configured to adjust a first capacitance of the first resonator circuit to a value that is less than a second capacitance of the first and second capacitors.

14. The IC of claim 11 wherein the IC further includes:
a transmitter that transmits the signal across the isolation barrier;
a receiver that receives the signal from the transmitter across the isolation barrier and that outputs a second signal based on the signal; and
a control module that, based on a clock signal and the second signal from the receiver, selectively adjusts a capacitance of the first resonator circuit.

15. The IC of claim 14 wherein the control module is configured to adjust the capacitance of the first resonator circuit to one of:
greater than a second capacitance of the first and second capacitors; and
less than the second capacitance of the first and second capacitors.

16. The IC of claim 1 wherein the IC further includes:
a transmitter that transmits the signal across the isolation barrier;
a receiver that receives the signal from the transmitter across the isolation barrier and that outputs a second signal based on the first signal; and
a control module that, based on a clock signal and the second signal from the receiver, controls switching of the first resonator circuit.

17. The IC of claim 15 wherein the regulator circuit includes a hysteretic comparator.

18. An integrated circuit (IC), comprising:
a first resonator circuit that receives a supply voltage at a first node and that includes:
a switching device connected directly to the first node and connected to a first ground potential;
a first inductor that is connected between the first node and the first ground potential;
a second inductor that is connected between the first node and the first ground potential;
a first inductor capacitor (LC) tank; and
first and second resistors connected between the switching device and the LC tank;
a second resonator circuit that outputs power to a load and that includes:
a third inductor that is inductively coupled to the first inductor across an isolation barrier and that is connected to a second ground potential, wherein the second ground potential is different than the first ground potential; and
a fourth inductor that is inductively coupled to the second inductor across the isolation barrier and that is connected to the second ground potential,
wherein the load draws power from a second node between the third and fourth inductors; and
a second LC tank including a plurality of switches;
a voltage divider that is connected to the second node; and a regulator circuit that generates a signal based on a comparison of an output voltage of the voltage divider with a reference voltage, wherein the plurality of switches of the second LC tank switch based on a state of the signal.

19. An integrated circuit (IC), comprising:

a first resonator circuit that receives a supply voltage at a first node and that includes:
- a switching device connected between the first node and a first ground potential;
- a first inductor that is connected between the first node and the first ground potential;
- a second inductor that is connected between the first node and the first ground potential;
- a first inductor capacitor (LC) tank comprising:
  - first and second capacitors; and
  - a plurality of switches that control a frequency of charging and discharging of the first LC tank; and
- a variable capacitor array connected in series with one of the first and second capacitors and in parallel with the plurality of switches;

a second resonator circuit that outputs power to a load and that includes:
- a third inductor that is inductively coupled to the first inductor across an isolation barrier and that is connected to a second ground potential, wherein the second ground potential is different than the first ground potential; and
- a fourth inductor that is inductively coupled to the second inductor across the isolation barrier and that is connected to the second ground potential;

a voltage divider that is connected to a second node between the third and fourth inductors;

a regulator circuit that generates a first signal based on a comparison of an output voltage of the voltage divider with a reference voltage;

a transmitter that transmits the first signal across the isolation barrier;

a receiver that receives the first signal from the transmitter across the isolation barrier and that outputs a second signal based on the first signal; and a control module that, based on a clock signal and the second signal from the receiver, selectively adjusts a capacitance of the first resonator circuit.

* * * * *

UNITED STATES PATENT AND TRADEMARK OFFICE
CERTIFICATE OF CORRECTION

PATENT NO. : 10,068,702 B2
APPLICATION NO. : 14/520499
DATED : September 4, 2018
INVENTOR(S) : Baris Posat et al.

Page 1 of 1

It is certified that error appears in the above-identified patent and that said Letters Patent is hereby corrected as shown below:

In the Specification

| | |
|---|---|
| Column 3, Line 63 | Delete "($V_{ADA}$)" and insert -- ($V_{DDA}$) -- |
| Column 9, Line 52 | Delete "SiO2" and insert -- $SiO_2$ -- |
| Column 10, Line 15 | Delete "SiO2" and insert -- $SiO_2$ -- |

In the Claims

| | |
|---|---|
| Column 16, Line 36 | In Claim 16, after "the", delete "first" |

Signed and Sealed this
Thirtieth Day of October, 2018

Andrei Iancu
*Director of the United States Patent and Trademark Office*